United States Patent

Uramoto et al.

Patent Number: 5,394,355
Date of Patent: Feb. 28, 1995

[54] READ ONLY MEMORY FOR STORING MULTI-DATA

[75] Inventors: Shinichi Uramoto; Tetsuya Matsumura; Masahiko Yoshimoto; Kazuya Ishihara; Hiroshi Segawa, all of Hyogo, Japan

[73] Assignee: Mitsubishi Denki Kabushiki Kaisha, Tokyo, Japan

[21] Appl. No.: 109,509

[22] Filed: Aug. 20, 1993

Related U.S. Application Data

[63] Continuation of Ser. No. 744,098, Aug. 13, 1991, Pat. No. 5,298,406.

[30] Foreign Application Priority Data

Aug. 28, 1990 [JP] Japan .................. 2-227060
Dec. 1, 1990 [JP] Japan .................. 2-400081

[51] Int. Cl.[6] .......................................... G11C 17/00
[52] U.S. Cl. .................... 365/104; 365/103; 365/94
[58] Field of Search ............ 365/104, 103, 94, 189.01, 365/174, 186, 189.11, 189.09

[56] References Cited

U.S. PATENT DOCUMENTS

| | | | |
|---|---|---|---|
| 4,165,538 | 8/1979 | Kitamura | 365/104 |
| 4,773,047 | 9/1988 | Uchino et al. | 365/104 |
| 4,809,224 | 2/1989 | Suzuki et al. | 365/94 |

Primary Examiner—Eugene R. LaRoche
Assistant Examiner—Vu Le
Attorney, Agent, or Firm—Lowe, Price, LeBlanc & Becker

[57] ABSTRACT

A read only memory includes a memory cell provided at an intersection between a word line and a bit line, and a plurality of reference potential transmission lines each receiving a reference potential determined in accordance with an externally applied potential designating signal. The memory cell includes a transistor element having a gate coupled to a word line, a drain coupled to a bit line and a source which is coupled to one of the reference potential transmission lines or is held in an open state. Stored data in the memory cell is changed by switching the potentials of the reference potential transmission lines. This enables storing of different data bits in one memory cell.

12 Claims, 27 Drawing Sheets

FIG. 5  PRIOR ART

| ADDRESS INPUT | WORD LINE | | | | | | | | ON STATE TRANSISTOR | READ OUT DATA |
|---|---|---|---|---|---|---|---|---|---|---|
| | 2e | 2f | 2g | 2h | 2i | 2j | 2k | 2ℓ | | |
| 1 | H | L | L | L | L | L | L | L | 1e | 0 |
| 2 | L | H | L | L | L | L | L | L | 1f | 1 |
| 3 | L | L | H | L | L | L | L | L | 1g | 0 |
| 4 | L | L | L | H | L | L | L | L | 1h | 1 |
| 5 | L | L | L | L | H | L | L | L | 1i | 0 |
| 6 | L | L | L | L | L | H | L | L | 1j | 0 |
| 7 | L | L | L | L | L | L | H | L | 1k | 1 |
| 8 | L | L | L | L | L | L | L | H | 1ℓ | 1 |

FIG. 12

| CASE No. | | 1 | 2 |
|---|---|---|---|
| POTENTIAL OF REFERENCE POTENTIAL LINE | REFERENCE POTENTIAL TRANSMISSION LINE 5a | H | L |
| | REFERENCE POTENTIAL TRANSMISSION LINE 5b | L | H |
| PART CONNECTED WITH THE SOURCE OF MEMORY TRANSISTOR | GND LINE 4 | 1 0 | 0 1 |
| | OPEN | 0 1 | 0 1 |

| READ OUT DATA | |
|---|---|
| CASE 1 | CASE 2 |

FIG. 14

| ADDRESS | WORD LINE | | | | ON STATE TRANSISTOR | POTENTIAL ON REFERENCE POTENTIAL LINE | | READ OUT DATA |
|---|---|---|---|---|---|---|---|---|
| | 12a | 12b | 12c | 12d | | LINE 5a | LINE 5b | |
| 1 | H | L | L | L | 11a | H | L | 0 |
| 2 | L | H | L | L | 11b | H | L | 1 |
| 3 | L | L | H | L | 11c | H | L | 0 |
| 4 | L | L | L | H | 11d | H | L | 1 |
| 5 | H | L | L | L | 11a | L | H | 0 |
| 6 | L | H | L | L | 11b | L | H | 0 |
| 7 | L | L | H | L | 11c | L | H | 1 |
| 8 | L | L | L | H | 11d | L | H | 1 |

Addresses 1–4: A
Addresses 5–8: B

FIG. 16

| ADDRESS | WORD LINE | | | | TURN-ON TRANSISTOR | POTENTIAL ON REFERENCE LINE | | READ-OUT DATA | | | |
|---|---|---|---|---|---|---|---|---|---|---|---|
| | 12a | 12b | 12c | 12d | | LINE 5b | LINE 5b | BIT LINE 3a | BIT LINE 3b | BIT LINE 3c | BIT LINE 3d |
| 1 | H | L | L | L | 11a, 11e, 11i, 11m | H | L | 0 | 1 | 1 | 0 |
| 2 | L | H | L | L | 11b, 11f, 11j, 11n | H | L | 1 | 0 | 0 | 0 |
| 3 | L | L | H | L | 11c, 11g, 11k, 11o | H | L | 0 | 0 | 0 | 1 |
| 4 | L | L | L | H | 11d, 11h, 11ℓ, 11p | H | L | 1 | 1 | 1 | 1 |
| 5 | H | L | L | L | 11a, 11e, 11i, 11m | L | H | 0 | 0 | 1 | 1 |
| 6 | L | H | L | L | 11b, 11f, 11j, 11n | L | H | 0 | 1 | 0 | 1 |
| 7 | L | L | H | L | 11c, 11g, 11k, 11o | L | H | 1 | 0 | 1 | 0 |
| 8 | L | L | L | H | 11d, 11h, 11ℓ, 11p | L | H | 1 | 1 | 0 | 0 |

A: addresses 1–4
B: addresses 5–8

FIG. 20

| PART CONNECTED WITH SOURCE OF MEMORY TRANSISTOR | POTENTIAL ON REFERENCE POTENTIAL LINE | READ OUT DATA | |
|---|---|---|---|
| | | CASE 1 | CASE 2 |
| REFERENCE POTENTIAL LINE 5a | | H | L |
| REFERENCE POTENTIAL LINE 5b | | L | H |
| LINE 5a | | 1 | 0 |
| LINE 5b | | 0 | 1 |
| GROUND LINE 4 | | 0 | 0 |
| POWER SUPPLY LINE 20 | | 1 | 1 |

FIG. 21
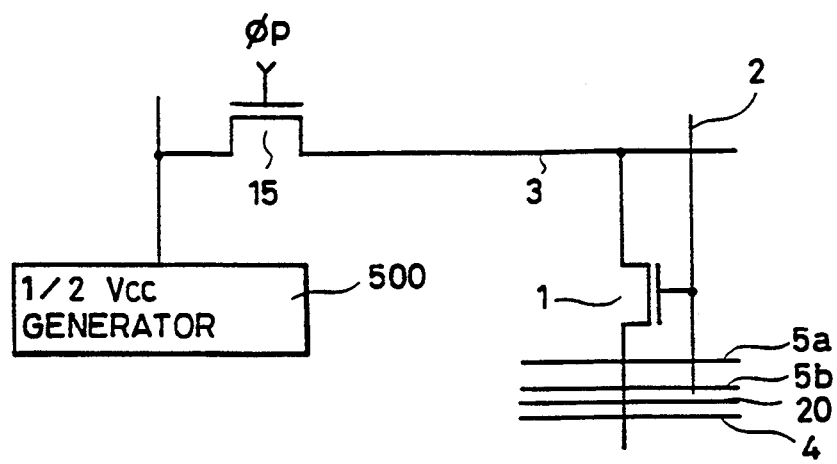
FIG. 22
| BANK | A | B | C |
|---|---|---|---|
| MEMORY CELL DATA | 1 | 1 | 1 |
| | 1 | 1 | 0 |
| | 1 | 0 | 1 |
| | 1 | 0 | 0 |
| | 0 | 1 | 1 |
| | 0 | 1 | 0 |
| | 0 | 0 | 1 |
| | 0 | 0 | 0 |
FIG. 23
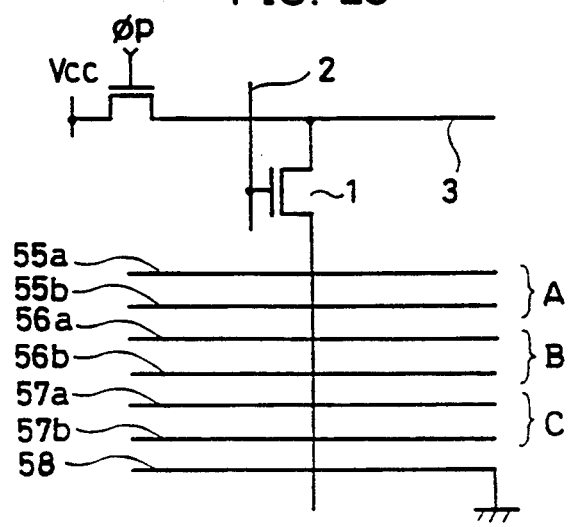

FIG. 24

| | | POTENTIAL ON LINES | | |
|---|---|---|---|---|
| | | BANK A | BANK B | BANK C |
| A | REFERENCE POTENTIAL LINE 55a | L | H | H |
| | REFERENCE POTENTIAL LINE 55b | H | L | L |
| B | REFERENCE POTENTIAL LINE 56a | H | L | H |
| | REFERENCE POTENTIAL LINE 56b | L | H | L |
| C | REFERENCE POTENTIAL LINE 57a | H | H | L |
| | REFERENCE POTENTIAL LINE 57b | L | L | H |
| PART CONNECTED WITH SOURCE OF MEMORY TRANSISTOR | REFERENCE POTENTIAL LINE 55a | 0 | 1 | 1 |
| | REFERENCE POTENTIAL LINE 55b | 1 | 0 | 0 |
| | REFERENCE POTENTIAL LINE 56a | 1 | 0 | 1 |
| | REFERENCE POTENTIAL LINE 56b | 0 | 1 | 0 |
| | REFERENCE POTENTIAL LINE 57a | 1 | 1 | 0 |
| | REFERENCE POTENTIAL LINE 57b | 0 | 0 | 1 |
| | GROUND LINE 58 | 0 | 0 | 0 |
| | OPEN | 1 | 1 | 1 |
| | | READ OUT DATA | | |

| S0 | S1 | SELECTED BANK |
|---|---|---|
| 1 | 1 | A |
| 1 | 0 | B |
| 0 | 1 | C |
| 0 | 0 | |

READ ONLY MEMORY FOR STORING MULTI-DATA

This application is a continuation of application Ser. No. 07/744,098, filed Aug. 13, 1991, now having U.S. Pat. No. 5,289,406.

BACKGROUND OF THE INVENTION

1. Field of the Invention

The present invention relates to a semiconductor memory device and particularly to a read only memory used for digital signal processing applications.

2. Description of the Background Art

As one type of semiconductor memory devices, there have been read only memories (referred to as "ROMs" hereinafter) for storing information such as predetermined programs or data, and these ROM's have been widely used for various purposes.

In digital signal processing fields, these ROM's are used as hold means for coefficients and storage means for operations of a table look-up type. In the operations of the table look-up type, results of the operations corresponding to inputs are prestored in a form of a table, and a result corresponding to an applied input is searched in the table for outputting. In the ROM's storing such tables, the inputs are used as addresses, and the results of operations are stored correspondingly to the respective addresses.

In integrated circuit devices directed to a digital signal processing, the ROM's are assembled in these integrated circuit devices. A major reason for which the ROM is used for such signal processing application is that one memory cell is formed of one transistor and thus a required hardware is smaller in size or scale than other memory devices such as SRAM's (static random access memories), upon storage of data of a common capacity. Thus, the ROM's have been used for the above purposes because of low costs and relatively small occupied area.

FIG. 1 schematically illustrates general structures of a ROM. In FIG. 1, the ROM includes a memory cell array 6 in which memory cells for storing information are disposed in a matrix of rows and columns, an address buffer 7 and an address decoder 8, both of which serve to select a desired memory cell in the memory cell array 6.

The address buffer 7 receives an externally applied address input to generate an internal address corresponding to the received address input. The address decoder 8 decodes the internal address received from the address buffer 7 to select the corresponding memory cell in the memory cell array 6.

The address input may include both of row and column addresses which designate the row and column in the memory cell array 6, respectively, or may include only the row address. The column address is not required if the ROM has a structure in which data in memory cells in one row are simultaneously read out, for instance, in a structure in which one row in the memory cell array 6 provides one word. In this case, the address input includes only the row address. If the ROM has such a structure that one row is one page and includes a plurality of words, it is necessary to read out the data in desired memory cells among the memory cells in one row. In this case, both of the row address and the column address are required for respectively designating the row and column addresses of the memory cells. In this case, the address input includes both the column and row addresses.

Thus, the address decoder 8 has a structure dependent on the structure of the ROM, and specifically, may include only the row decoder for selecting a row in the memory cell array 6 or both of the row and column decoders respectively selecting a row and a column in the memory cell array 6. In FIG. 1 illustrating the ROM, the address decoder 8 is generally illustrated to include both of the cases described above.

The ROM shown in FIG. 1 further includes a control signal generator circuit 10 responsive to externally applied control signals $\overline{CE}$ and $\overline{OE}$ for generating internal control signals such as signals AT, AT', $\phi p$ and OE, an output circuit 9 which is activated in response to the internal control signal OE, to sense and amplify the data in the memory cells selected by the address decoder 8 for sending to an external as an output data D, and a precharge circuit 41 for precharging bit lines (which are internal data transmission line; and will be described later) in the memory cell array 6, for instance, in a standby state of the ROM to a predetermined reference potential such as a supply potential Vcc level.

The internal control signal AT provides a timing at which an address input 7 is strobed to generate an internal address in the address buffer. The internal control signal AT' provides a timing for address decoding in the address decoder 8. The output circuit 9 generally includes a sense amplifier for amplifying data of a selected memory cell in the memory cell array 6 and an output buffer for performing a buffer processing on this amplified output to generate an output data. The internal control signal OE determines a timing for activating this output circuit 9. The output buffer may be in an output high impedance state when the control signal OE is inactivated, or may be constructed to have an output fixed at a predetermined reference potential. The sense amplifier is activated to execute the amplifying operation in response to this internal control signal OE.

The precharge circuit 41 is activated in response to the internal control signal $\phi p$ to precharge respective bit lines to the predetermined reference potential.

The externally applied control signal $\overline{CE}$ is a control signal for enabling the ROM. The control signal $\overline{OE}$ is a control signal for providing a data output timing for the ROM. The precharge signal $\phi p$ is generally in an activated state when the control signal $\overline{CE}$ is in an inactivated state.

FIG. 2 schematically illustrates a structure of a memory cell contained in the memory cell array 6 in the ROM shown in FIG. 1. In FIG. 2, ROM memory cell MC includes one MOS transistor (insulated gate type field effect transistor) 1. This MOS transistor 1 has a gate connected to a word line 2 and a source connected to a reference potential line 4 which supplies a first reference potential Vss (e.g., a ground potential). A drain of the MOS transistor 1 is selectively connected to or disconnected from a bit line 3, depending on a stored data in this memory cell MC. Although the source and drain of the MOS transistor 1 are determined in accordance with its application, a conduction terminal connected to the bit line will be called as the drain in the following description. Connection and disconnection of a region 16 encircled by a broken line in FIG. 2 is determined depending on whether a wiring is masked or not in fabrication steps of the transistor. The bit line 3 is provided at its one end with a precharge transistor 15 which is responsive to the precharge signal $\phi p$ for connecting the bit line 3 to a second reference potential Vcc which is, for instance, an operation power supply potential. Now, an operation of the ROM shown in FIGS. 1 and 2 will be described with reference to an operation waveform diagram in FIG. 3.

If the control signal $\overline{CE}$ is at "H" and the ROM is in the disabled state (unselected state) and thus in the standby state, the precharge signal $\phi p$ is at the "H" level. A precharge transistor 15 is in the ON-state, and the bit line 3 is precharged to "H", i.e., the supply potential Vcc level.

When the control signal $\overline{CE}$ falls to "L", this ROM is enabled to start a memory cycle. In response to the fall of this control signal $\overline{CE}$, the address buffer 7 strobes an externally applied address input and generates an internal address. This internal address is generated at the timing determined by the control signal AT. The address decoder 8 decodes the internal address from the address buffer 7, and selects a corresponding row in the memory cell array 6 to transmit a row selection signal WL to the word line corresponding to the selected row. The decoding timing in the address decoder 8 is determined by the internal control signal AT'. When the row selection signal WL is transmitted to the selected word line to increase the potential thereof to "H", the transistor 1 in the memory cell MC connected to this selected word line is turned on.

Description will further be made with reference to such a case that the drain of the transistor 1 is connected to the bit line 3 through the region 16. The precharge transistor 15 connected to the bit line 3 is turned off when the memory cycle starts, and the bit line 3 is held at a floating state of "H". In this case, a precharged charges in the bit line 3 are discharged through the turned-on transistor 1 to a first reference potential Vss, resulting in lowering of the potential of the bit line 3.

If a wiring is not formed in the region 16 between the transistor 1 and the bit line 3, there is no discharging path for the charges between the transistor 1 and the bit line 3. In this condition, the bit line 3 maintains its precharged potential. The potential of this bit line 3 will be sensed and amplified by an amplifier included in the output circuit 9. An activation of this amplifier is effected by the control signal $\overline{OE}$. This may also be executed by a delay signal of the control signal $\overline{CE}$.

When the control signal $\overline{OE}$ falls to "L", the output circuit 9 (output buffer) is activated, and the data in the selected memory cell is output as the output data D after amplification. FIG. 3 illustrates a case in which the signal $\overline{OE}$ is at "H" and the output data D is in a high impedance state. When the output control signal $\overline{OE}$ falls to "L", the output data D is initially invalid and will be valid after a predetermined time. This is due to a fact that it is unclear whether a value of the output data at the time of falling of this control signal $\overline{OE}$ is the data in the selected memory cell. This is due to a fact that the activating timing of the amplifier included in the output circuit 9 is determined by the control signal $\overline{OE}$ or $\overline{CE}$, and, when the output circuit 9 is activated, it is unclear whether the data in the selected memory cell is output or not as the output data D through the output buffer after amplification by the amplifier.

In the operation waveform diagram shown in FIG. 3, there is illustrated an example, in which holding of the data "1" by the memory cell MC corresponds to a case in which the region 16 shown in FIG. 2 is disconnected and the bit line 3 holds the precharged potential, and in which holding of the data "0" by the memory cell MC corresponds to a case in which the region 16 is connected and the potential of the bit line 3 lowers.

When one memory cycle is completed, the control signal $\overline{CE}$ rises to "H". The control signal $\overline{CE}$ can return to "L" only after elapsing of a precharging time Tb. This time Tb is a time required for precharging the bit line 3 to the operation power supply potential Vcc level.

As described above, since the ROM's have simple memory cell structures suitable for high degree of integration, they are generally and widely used for storing data and programs which require no change. However, in the ROM's, one memory cell is formed of one transistor, so that the number of the required memory transistors corresponds to the memory capacity. FIG. 4 illustrates a structure of the ROM of 8 words × 1 bit.

In FIG. 4, eight word lines 2e, 2f, 2g, 2h, 2i, 2j, 2k and 2l and one bit line 3 form intersections at which memory cell transistors 1e, 1f, 1g, 1h, 1i, 1j, 1k and 1l are disposed, respectively.

The memory transistors 1e, 1g, 1i and 1j are connected at their drains through the regions 16 to the bit line 3. The drains of the memory transistors 1f, 1h, 1k and 1l are isolated at the wiring regions 16 from the bit line 3. Sources of the respective memory transistors 1e-1l are connected to a ground line 4, which supplies the ground potential, i.e., the first reference potential (referred to hereinafter as "ground potential"), and gates thereof are connected to the corresponding word lines 2e-2l, respectively.

The address input for designating the memory cell transistors is externally applied and is decoded by the address decoder 8 (see FIG. 1) to designate a word line to which the row selection signal WL is transmitted. In the structure shown in FIG. 4, the row selection signal WL is transmitted to one of the word lines 2e-2l. It is assumed that the word lines 2e-2l correspond to address 1-address 8, respectively.

In the ROM of 8 words × 1 bit, the address inputs, potentials in the word lines, selected memory cell transistors (turned-on transistors) and the data read at respective times have a relationship listed in FIG. 5.

For example, if the address input is the address 1, the word line 2e is selected and the potential thereof rises to "H" so that the memory cell transistor 1e is turned on. Since this memory cell transistor 1e has the drain connected to the bit line 3, the potential of the bit line 3 falls to "L" and "0" is read as the data. Similarly, in the other memory cell transistors, the potential of the word line corresponding to an address input rises to "H" and the memory cell transistor connected to the selected word lines is turned on, respectively, so that the data to be read is determined in accordance with the connection conditions between the drain and the bit line 3.

As described above, the memory cell of the ROM of 8 words × 1 bit requires one transistor per each memory cell and thus totally requires eight transistors. Generally, the ROM of N words × M bits requires N × M transistors in the memory cell array. Therefore, an increase of the capacity of the ROM causes a problem that the number of the memory cell transistors included therein increases and thus the occupied area thereof also increases. Further, if the memory cell array area is restricted, it is difficult to obtain the memory cell transistor formation region having a sufficient area, and thus the memory cell transistors having high reliability cannot be obtained.

If ROM's described above are used for a digital signal processing purpose, a so-called bank system in which the ROM's are switched in accordance with process contents is often employed. FIG. 6 schematically illustrates the structure of ROMs for achieving an operation in a table look-up manner.

In FIG. 6, there are illustrated a first ROM 31a and a second ROM 31b which have stored sets of coefficients corresponding to operation modes, respectively. Either of the first and second ROM's 31a and 31b is selected in accordance with the operation mode, i.e., in accordance with the processing contents by an operation mode designating signal SA which is selectively applied to the selection inputs SE of the first and second ROM's 31a and 31b.

The ROM 31a has stored output results a.x corresponding to inputs x and the ROM 31b has stored output results b.x corresponding to the inputs x. These inputs x are applied to the ROM's 31a and 31b as the address inputs, respectively.

In the ROM bank structure described above, if the operation designating signal SA has selected the ROM 31a, outputs z=a.x are obtained from the inputs x. If the operation mode designating signal SA has selected the ROM 31b, outputs z=b.x are obtained from the inputs x. As an example of the bank structure, such a case can be envisaged that one of the ROM's outputs results of multiplication of the inputs x by 2 and the other ROM outputs results of division of the inputs x by 2.

The bank structure in which the banks are switched in accordance with the operation modes require a plurality of ROM's, so that, assembling of the ROM's in an integrated circuit device dedicated to the digital signal processing causes a problem of a large occupied area. In this case, although combinations of the inputs x and the operation mode designating signals SA may be used as the addresses so as to provide two banks only by one ROM, this one ROM requires the memory capacity same as those of the two ROM's shown in FIG. 6, resulting in large scales or sizes.

An image processing purpose is a typical example of the digital signal processing purposes. In the image processing field, transform such as orthogonal transform or conversion of sampling frequencies is often performed. For example, in discrete Fourier transform, coefficients for respectively executing Fourier transform and inverse Fourier transform as well as matrix substitution for a butterfly operation are stored in different ROM's.

FIG. 7 schematically illustrates structures for a matrix operation circuit in a semiconductor integrated circuit device dedicated to such an image processing. Structure of the integrated circuit device for the signal processing shown in FIG. 7 is disclosed, for instance, in "Nikkei Electronics", No.492, Feb. 5, 1990, pp 174-175. FIG. 7 illustrates a part of the circuit structure for performing a two, dimensional discrete cosine transform, and the illustrated device includes a matrix operation circuit 33 as well as ROM's 32a, 32b, 32c and 32d for storing sets of predetermined coefficients, respectively. In order to set one of these ROM's 32a-32d in a selected state, an externally applied operation mode designating signal SB (2 bits) is selectively applied to selection inputs SE of the ROM's 32a-32d.

A matrix operation circuit 33 performs a transform operation using pixels of predetermined n rows by m columns (e.g., 8 rows by 8 columns) as one unit. That is; when one unit block of pixels Xij is applied, the matrix operation circuit 33 multiplies this applied input Xij by the coefficient from one of the ROM's 32a-32d and the multiplied result will be sequentially accumulated to form an output $\Sigma Aij.Xij$, where Aij is a coefficient supplied from the selected ROM.

In the structures shown in FIG. 7, one of the coefficient ROM's is selected in accordance with the operation mode, so that the predetermined operation is performed in the matrix operation circuit 33 with respect to the input Xij and the coefficient from this selected ROM. In this operation, if resolution (constituent bit number, i.e., data width) of the input Xij is increased and the scales of the unit block handled by the matrix operation circuit 33 are increased, the number of the coefficients stored in the respective ROM's 32a-32d is increased and the data width of the coefficients is also increased, resulting in increase of capacities of the ROM's. Therefore, in the structures operable to switch these ROM's in accordance with the respective operation modes, a plurality of ROM's are required and the scales of the ROM part for storing the coefficients are increased, which impedes a high integration.

The structure shown in FIG. 7 employs the four coefficient ROM's for a reason that it supports following ROM's, i.e., a ROM storing coefficients for the discrete cosine transform, a ROM storing coefficients for performing an inverse discrete cosine transform, a ROM storing coefficients by which a matrix substitution is executed for a butterfly operation, and a ROM for storing coefficients utilized to obtain a function as a filter (low-pass filter) in a loop for reducing a block distortion generated in a decoding operation with the discrete cosine transform. When the function as the filter in the loop is utilized, the matrix operation circuit 33 functions as one digital filter.

Further, as shown in FIG. 8, a ROM is often used as a program ROM for storing a predetermined program. This program ROM 35 usually stores a microcoded program, and has such an advantage that a CPU (central processing unit) 36 can execute a predetermined processing program at a high speed without accessing an external storage device. For the control purposes and others, if the above CPU 36 and program ROM 35 are used as a control circuit, they are often used in a one-chip microcomputer. If the scales of the processing program stored in this program ROM 35 are increased, the scales of the program ROM 35 are also increased, and thus such control circuit can not be constructed to be compact in one chip.

Then, description will be made with respect to a control system which determines the system to be normal only when both of a state variable at a point A and a state variable at a point B satisfy predetermined conditions. The input x indicates a given state variable at the point A and the input y indicates a given state variable at the point B. Consideration will be made with respect to the control system adapted to hold values ax and ay, which are the inputs x and y multiplied by a coefficient a, at predetermined reference values p and q, respectively. A structural example of the above control system is illustrated in FIG. 9.

In FIG. 9, this control system includes a first ROM 41 storing multiplied results ax of the inputs x in a form of a table, a second ROM 42 for storing multiplied results ay of the inputs y in a form of a table, a subtracter 43 which subtracts the predetermined reference value p from an output ax of the first ROM 41, a subtracter 44 which subtracts the second reference value q from an output ay of the second ROM 42, and an operation circuit 45 adapted to determine that the system is in a normal operation and generate a normal indication signal only when both of the outputs of the subtracter 43 and 44 are smaller than a predetermined value. As an example of a system, there may be a case in which the inputs x and y are detected outputs of thermo-couples, and the coefficient "a" is determined to convert these detected outputs to temperatures.

The operation circuit 45 is adapted to output the system normal indication signal only when the output ax-p from the subtracter 43 is not more than a first predetermined value (allowable error) and the output ay-q from the subtracter 44 is not more than a second predetermined value. In this case, the inputs x and y are required to be processed simultaneously, so that two ROM's, i.e., the first ROM 41 and the second ROM 42 storing the same coefficient are required. In this case, although the first and second ROM's 41 and 42 have same storage contents, the separate and different inputs x and y cannot be applied simultaneously to one of the. ROM's. Therefore, such a problem is caused that the control system described above cannot have compact structures and a small occupied area.

SUMMARY OF THE INVENTION

An object of the invention is to provide a ROM, overcoming above-noted disadvantages of the prior art ROM's, in which a storage capacity can be remarkably increased with a same occupied area.

Another object of the invention is to provide a ROM which implement a more storage capacity with fewer memory transistors.

Still another object of the invention is to provide a ROM in which one memory cell can represent a plurality of different word bits.

Yet another object of the invention is to provide a ROM having a small occupied area and capable of designating a plurality of different addresses in one memory cycle.

A read only memory according to a first aspect of the invention, includes at least one bit line for transmitting data, word lines for transmitting row selection signals, and memory cells disposed at intersections of the bit line and the word lines for storing information.

The read only memory of the first aspect further includes a plurality of reference potential transmission lines to which reference potentials are transmitted, respectively, and potential setting means for setting the potential of each reference potential transmission line in response to an externally applied potential designating signal.

Each memory cell includes a memory cell transistor which is formed to connect or disconnect one of said reference potential transmission line to or from the corresponding bit line in response to the activated row selection signal in the corresponding word line.

A read only memory according to a second aspect of the invention comprises a plurality of selection signal transmission lines to which selection signals are independently transmitted, respectively, a plurality of reference potential transmission lines to which reference potentials are transmitted, respectively, and a memory cell including a plurality of transistor elements disposed correspondingly to the selection signal transmission lines, respectively. Each of these transistor elements includes a control electrode coupled to the corresponding selection signal transmission line, and a first conduction terminal coupled to a common node which is commonly provided at these transistor elements.

The read only memory according to the second aspect further comprises a plurality of data transmission lines provided correspondingly to the transistor elements, respectively. The common node is adapted to be selectively connected to one of the reference potential transmission lines or disconnected from all of the plurality of reference potential transmission lines. The data transmission lines each transmit data which forms storage information of a memory cell and is determined by connection and disconnection with respect to one of the reference potential transmission lines through the corresponding transistor elements.

The read only memories of the first and second aspects have the reference potential transmission lines in which potentials are switched in response to externally applied signals. Storage of the information in the transistors of the memory cell is based on the conditions of connection between the bit line and these reference potential transmission lines when a word line is selected.

The potentials of the reference potential transmission lines are changed in response to the externally applied potential designating signals, which allows change of the information which the memory cell transistors transmit to the bit line when a word line is selected. Therefore, even if a same memory cell is selected, a plurality of different word bits can be represented, and thus one memory cell can correspond to a plurality of addresses in the read only memory.

Each transistor element in the memory cell of the second aspect stores the information, based on the connection condition between the corresponding bit and these reference potential transmission lines when the corresponding word line is selected. The mutually independent selection signals are transmitted to the selection signal transmission lines related to one memory cell. Therefore, the transistor elements in the memory cell can be independently held in the selected conditions. Accordingly, one memory cell can be simultaneously selected by two kinds of selection signals and the stored information in this memory cell can be read in parallel through the corresponding data transmission lines.

These structures further enable simultaneous setting of the memory cells at the different addresses in the selected conditions and simultaneous transmitting of the information in the selected memory cells to the data transmission lines for reading. This provides the read only memory in which a plurality of addresses can be designated in one memory cycle.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a list for illustrating operations of a read only memory shown in FIG. 4;

FIG. 12 is a list for illustrating operations of a ROM memory cell shown in FIG. 10;

FIG. 14 is a list for illustrating operations of a ROM shown in FIG. 13;

FIG. 16 summarizes the operation of the memory arrangement of FIG. 15 in a list;

FIG. 20 is a list for illustrating operations of a ROM memory cell shown in FIG. 16;

FIG. 21 shows another arrangement for precharging the bit line according to another embodiment of the invention;

FIG. 22 is a list of possible combinations of storage data which one memory cell can store when three banks are to be represented by one ROM;

FIG. 23 schematically illustrates structures of a memory cell for attaining a list shown in FIG. 22;

FIG. 24 is a list for illustrating operations of a memory cell shown in FIG. 23;

DETAILED DESCRIPTION OF THE PREFERRED EMBODIMENTS

Figure 1:
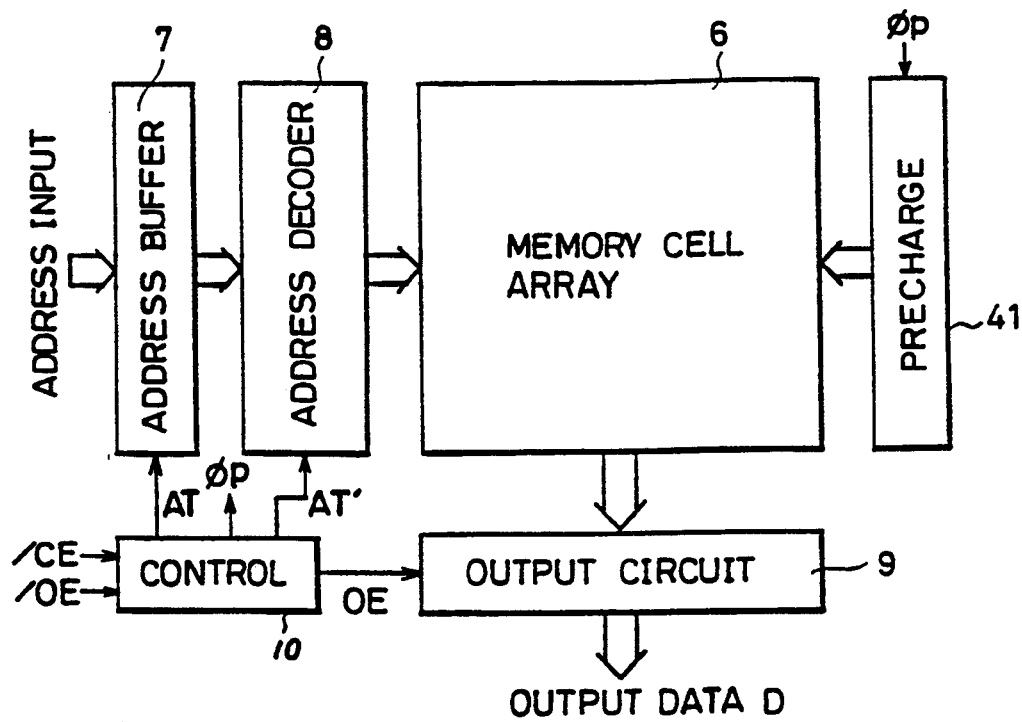
FIG. 1 illustrates a whole structure of a prior art read only memory.
Figure 2:
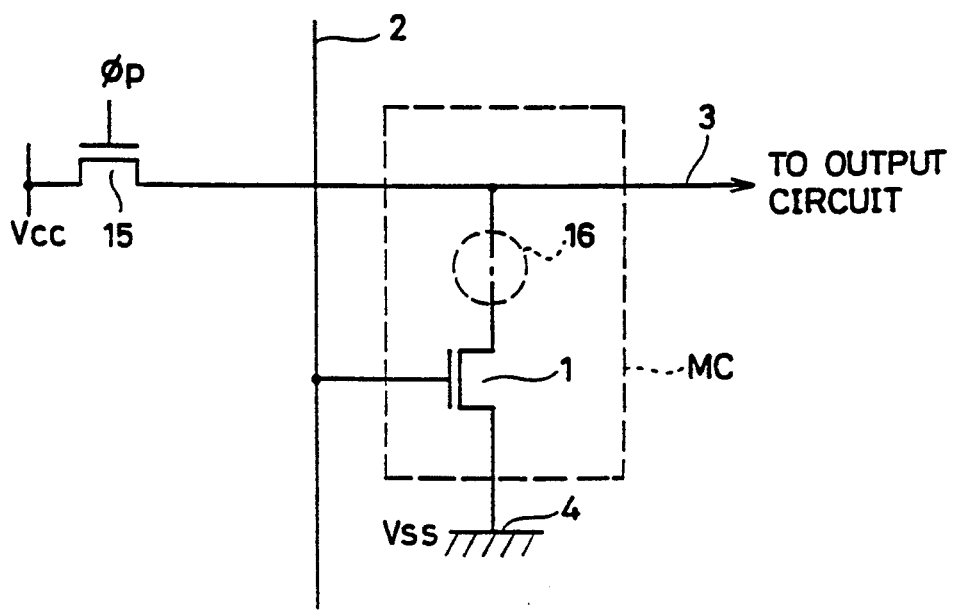
FIG. 2 illustrates a structure of a memory cell in a prior art read only memory.
Figure 10:
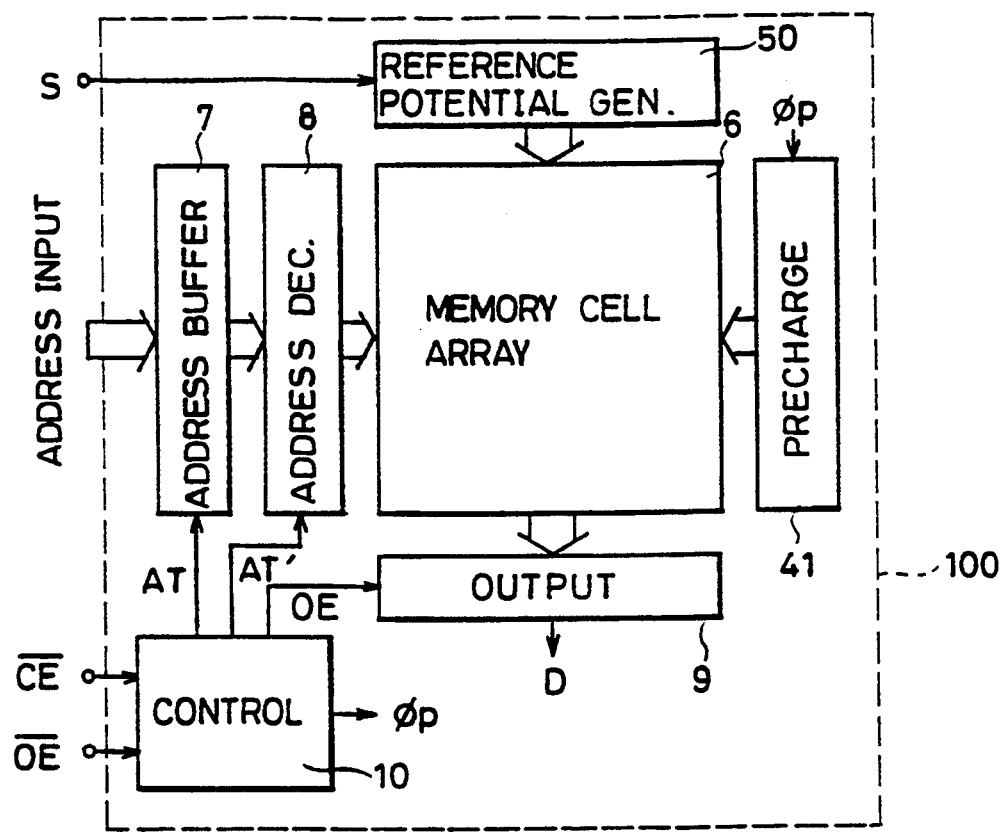
FIG. 10 schematically illustrates a whole structure of a ROM of an embodiment of the invention.

FIG. 10 schematically illustrates a whole structure of a ROM of an embodiment of the invention. In FIG. 10, a ROM 100 comprises, in addition to components of the prior art ROM shown in FIG. 1, a reference potential generation circuit 50 responsive to an externally applied potential designating signal S, for generating a predetermined set of reference potentials and transmitting them to reference potential transmission lines (not shown in FIG. 10) provided in a memory cell array 6. In the ROM shown in FIG. 10, portions corresponding to those in the prior art ROM have allotted same reference numbers.

This potential designating signal S may be a signal such as an operation mode designating signal, a bank selection signal or an address signal. If it is an address signal, the signal S may be internally generated in accordance with the address signal.

Figure 11:
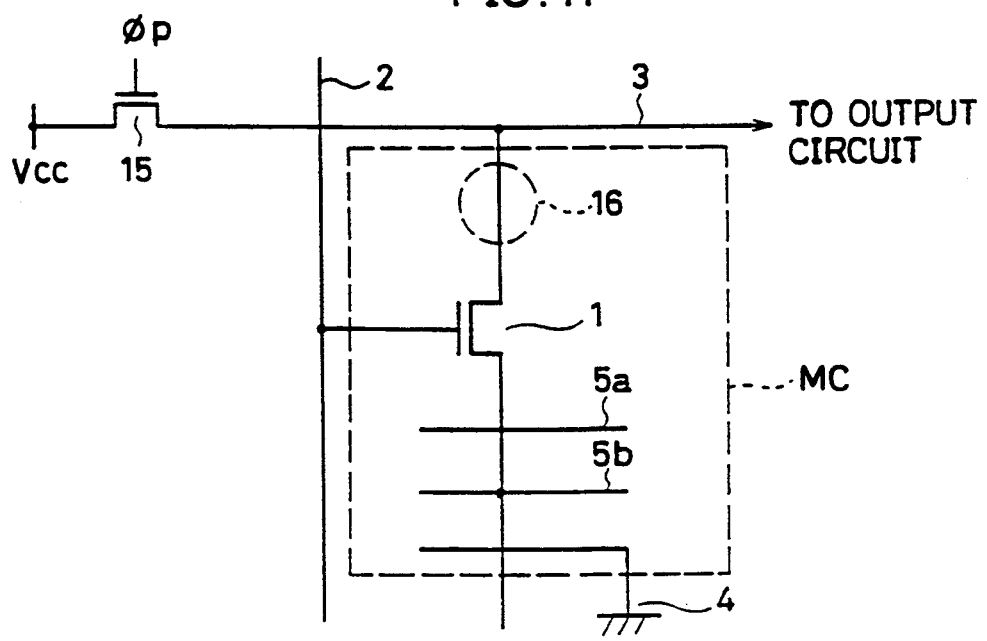
FIG. 11 illustrates an example of structures of a memory cell in a ROM of an embodiment of the invention.

FIG. 11 illustrates an example of structures of a memory cell in the ROM of an embodiment of the invention. In FIG. 11, a memory cell MC includes one MOS transistor 1 and reference potential transmission lines 5a and 5b, each receiving a reference potential. The reference potential generation circuit 50 shown in FIG. 10 transmits to these reference potential transmission lines 5a and 5b combinations of the reference potentials determined in accordance with the externally applied potential designating signal S.

The memory cell transistor 1 has a drain connected to a bit line 3, a gate connected to a word line 2 and a source selectively disconnected from and connected to one of the reference potential transmission lines 5a and 5b or a ground line 4. In accordance with the condition of the connection between the source of this memory transistor 1 and the reference potential transmission lines (the ground line 4 is referred to as "reference potential transmission line" hereinafter), information stored in this memory cell MC is determined. Following two cases are possible combinations of the reference potentials applied to the reference potential transmission lines 5a and 5b. Case 1: The potential of "H" is transmitted to the first reference potential transmission line 5a, and the potential of "L" is transmitted to the second reference potential transmission line 5b. Case 2: The potential of "L" is transmitted to the first reference potential transmission line 5a, and the potential of "H" is transmitted to the second reference potential transmission line 5b. In each of these cases 1 and 2, the connection conditions of the source of the memory cell transistor and the stored information in these conditions have relationship listed in FIG. 12.

Now, data reading operations of the ROM of an embodiment of the invention will be described below with reference to FIGS. 10 to 12. The stored information in the memory cell MC is determined by the connection relationship between the source terminal of the memory cell transistor 1 and the reference potential transmission lines 4, 5a and 5b. First, the case 1 will be described.

In a manner similar to that in the prior art, the bit line 3 is precharged to "H" of the power supply potential Vcc. After this precharging, the word line 2 is selected by an address input, and the row selection signal WL is transmitted to this selected word line 2 to raise the potential of the word line 2 to "H".

At this time, the potential of the first reference potential transmission line 5a is set at "H" and the potential of the second reference potential transmission line 5b is set at "L". When the memory cell transistor 1 becomes conductive in response to the potential of the selected word line 2, the charges precharged in the bit line 3 are discharged if the source terminal thereof is coupled to the ground line 4 or the second reference potential transmission line 5b. Thereby, the potential of the bit line 3 decreases and the data "0" is read.

If the source terminal of the memory cell transistor 1 is connected to the first reference potential transmission line 5a or held in an open condition (disconnected or open-circuited), the charges precharged in the bit line 3 are not discharged and the bit line 3 maintains the precharged potential, and thus the data "1" is read.

Then, the case 2 will be described. In this case, the potential of the first reference potential transmission line 5a is "L" and the potential of the second reference potential transmission line 5b is "H". After precharging of the bit line 3, the potential of the word line 2 is set at "H" to turn on the memory cell transistor 1. If the source terminal of the memory cell transistor 1 is connected to the ground line 4 or the first reference potential transmission line 5a, the charges precharged in the bit line 3 are discharged, and the data "0" is read.

If the source terminal of the memory cell transistor 1 is connected to the second reference potential transmission line 5b or held in the open state, the precharged potential of the bit line 3 is not changed, and thus the data "1" is read.

As described above, by switching the reference potentials of the reference potential transmission lines 5a and 5b, two independent data can be stored in one memory cell.

Figure 13:
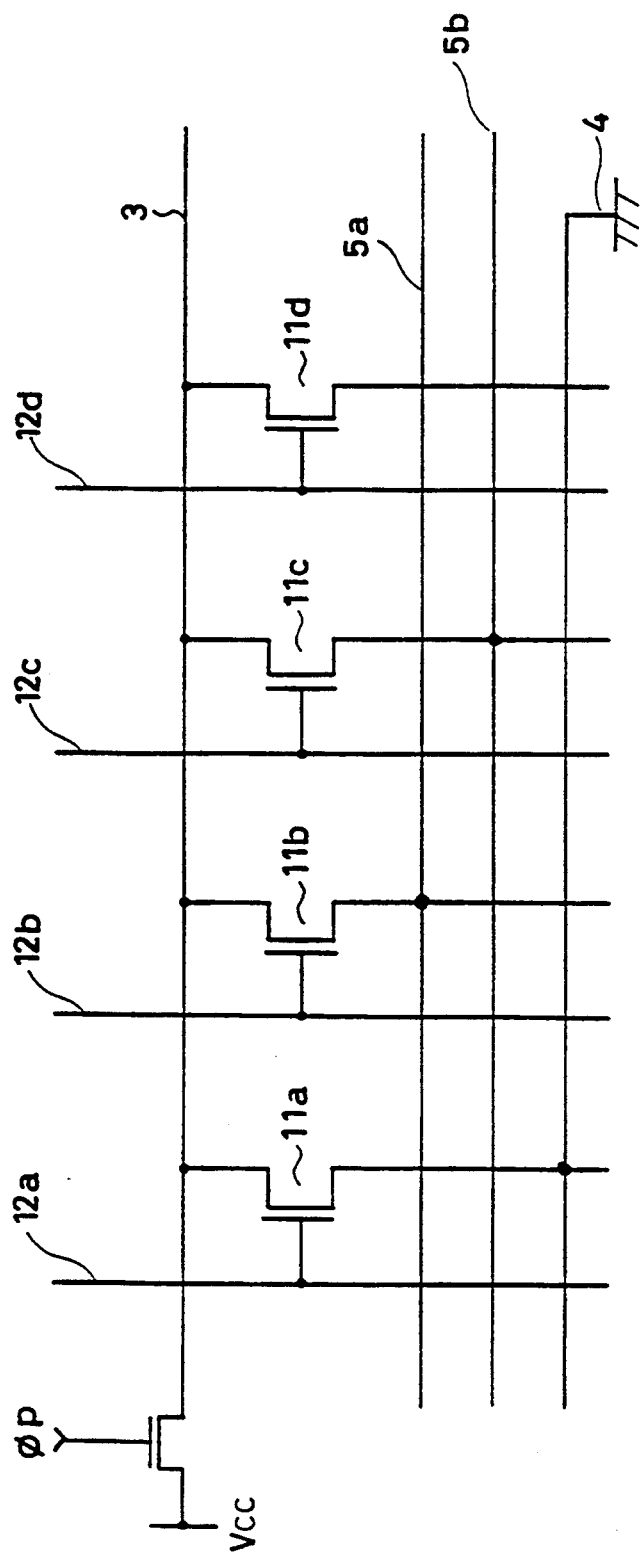
FIG. 13 illustrates a structure of a memory cell array part included in a ROM of 8 words×1 bit including a ROM memory cell shown in FIG. 11.

FIG. 13 illustrates a structural example of a memory cell array in the ROM of 8 words×1 bits, which uses the memory cell structure shown in FIG. 11. In FIG. 13, four word lines 12a, 12b, 12c and 12d and the bit line 3 have intersections at which memory cell transistors 11a, 11b, 11c and 11d are disposed, respectively.

Parallel to the bit line 3, there are disposed the first reference potential transmission line 5a, the second reference potential transmission line 5b and the ground line 4.

The memory cell transistor 11a has a source coupled to the ground line 4, a gate coupled to the word line 12a and a drain coupled to the bit line 3. The memory cell transistor 11b has a source coupled to the first reference potential transmission line 5a, a gate coupled to the word line 12b and a drain coupled to the bit line 3. The memory cell transistor 11c has a source coupled to the second reference potential transmission line 5b, a gate coupled to the word line 12c and a drain coupled to the bit line 3. The memory cell transistor 11d has a source held in the open state (disconnected state), a gate coupled to the word line 12d and a drain coupled to the bit line 3.

By switching the potentials of the reference potential transmission lines 5a and 5b, one memory cell can store the information in two addresses. That is; the structure in which one word line corresponds to two different addresses can be obtained.

FIG. 14 is a list illustrating operations of the ROM shown in FIG. 13.

As shown in FIG. 14, in a case A in which the potentials of the reference potential transmission lines 5a and 5b are "H" and "L", respectively, the memory cell transistors 11a–11d are selected corresponding to the addresses 1 to 4 and the data "0", "1", "0" and "1" are read.

In a case B in which the potentials of the reference potential transmission lines 5a and 5b are switched to "L" and "H", respectively, the memory cell transistors 11a–11d are selected corresponding to the addresses 5 to 8 and the data "0", "0", "1" and "1" are read, respectively Thus, in the above structure, the word line 12a corresponds to the addresses 1 and 5, the word line 12b corresponds to the addresses 2 and 6, the word line 12c corresponds to the addresses 3 and 7, and the word line 12d corresponds to the addresses 4 and 8.

Figure 4:
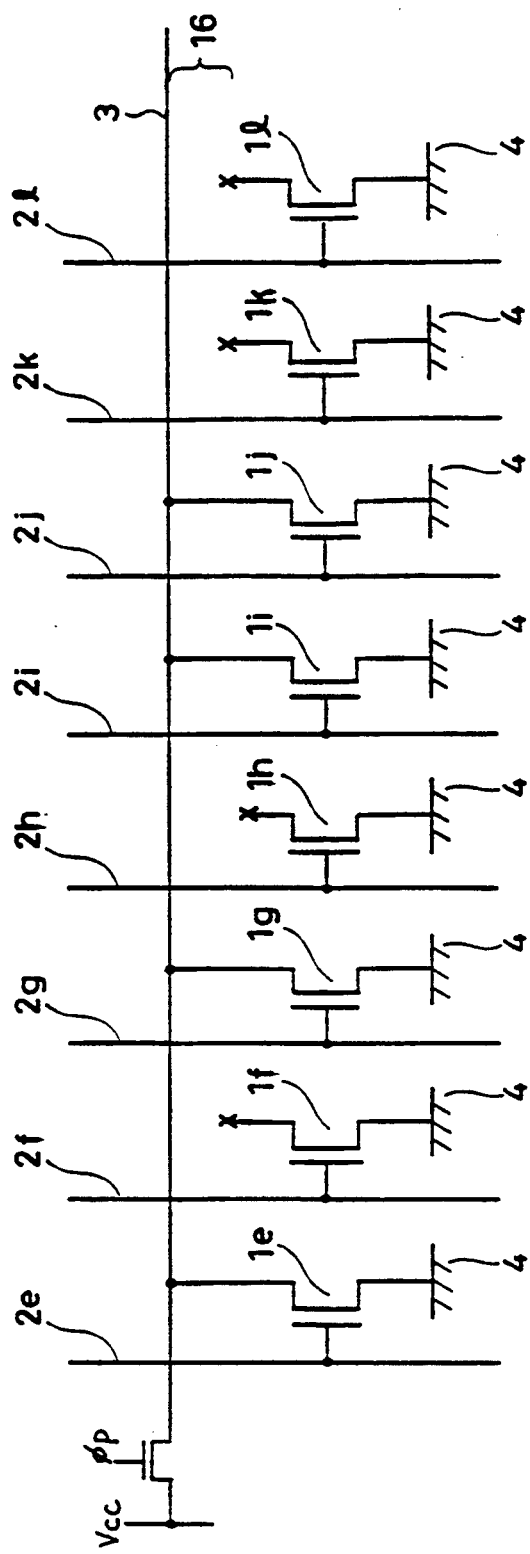
FIG. 4 illustrates an example of structures of a memory cell array in a prior art read only memory.

As described above, even if the memory cell transistor has the source terminal connected to a fixed point or portion, it is possible to cause one of the word lines to correspond to a plurality of addresses by switching the potentials of the reference potential transmission lines 5a and 5b. Therefore, even in the ROM having a same capacity, the number of the memory cell transistors can be remarkably reduced. For example, in a comparison between the prior art ROM of 8 words×1 bit structures shown in FIG. 4 and the memory cell array of the ROM in FIG. 13, it can be found that the number of the memory cell transistors in the structure shown in FIG. 13 is 4 and thus is halved with respect to that of the prior art.

Figure 15:
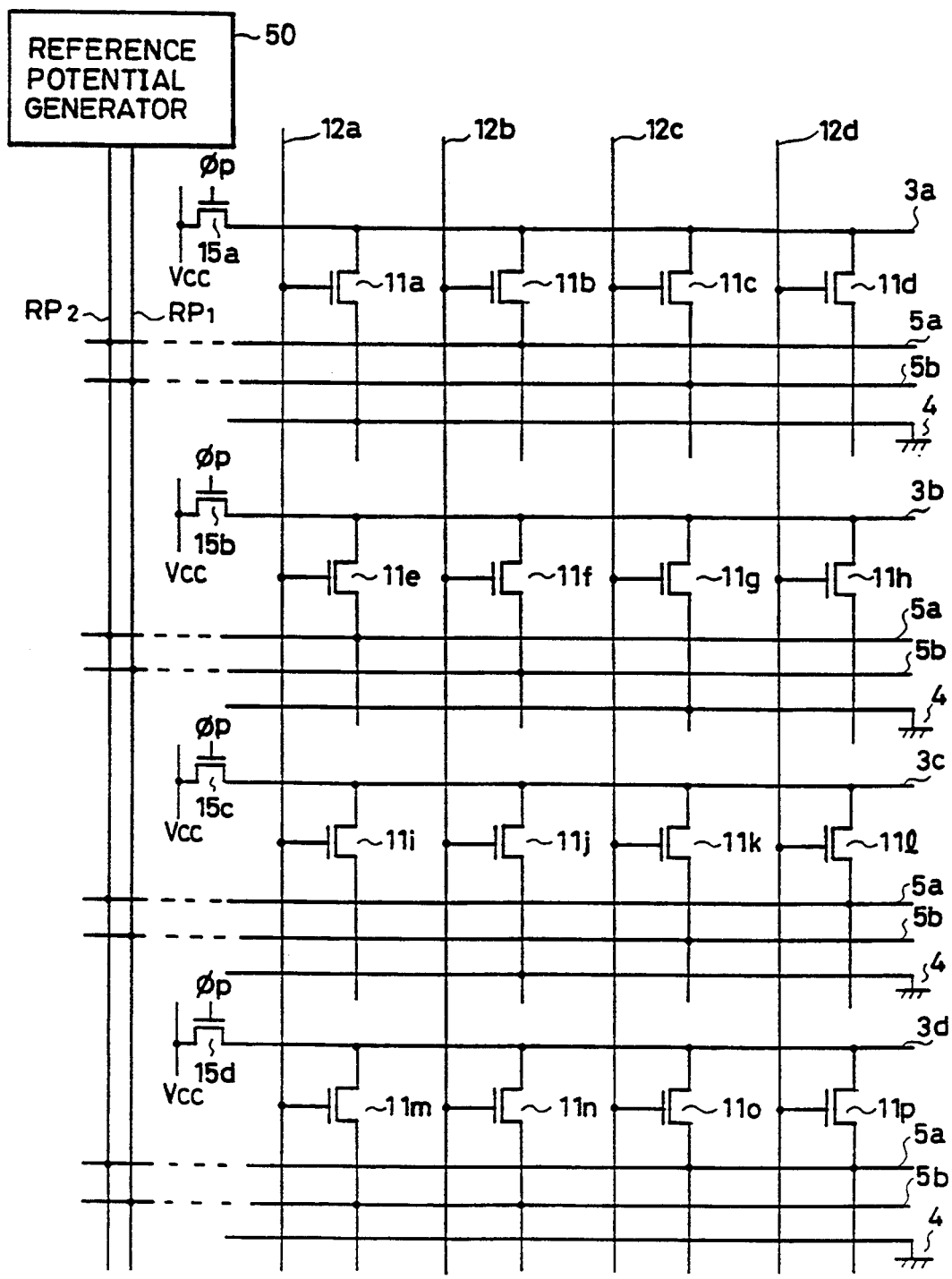
FIG. 15 shows an arrangement of memory cells of 4 rows by 4 columns corresponding to the memory cells shown in FIG. 13.

FIG. 15 shows a memory array arrangement for a ROM of 8 words by 4 bits using the memory structure shown in FIG. 11.

Referring to FIG. 15, four word lines 12a, 12b, 12c and 12d are arranged to run intersecting four bit lines 3a, 3b, 3c and 3d. A group of reference potential transmission lines 4, 5a and 5b are provided for each of bit lines 3a through 3d. Reference potential transmission lines 4, 5a and 5b are arranged running parallel with the bit lines 3a through 3d. Reference potential transmission lines 5a and 5b are connected, respectively, to main reference line RP1 and RP2 running parallel with the word lines 12a through 12d. Main reference lines RP1 and RP2 receive reference potentials from the reference potential generator 50.

Memory transistors 11a through 11d are disposed at respective intersections of the word lines 12a through 12d and the bit line 3a. Memory transistors 11a through 11d have their gates connected to respective word lines 12a through 12d. Memory transistor 11a has a source terminal connected to the ground line 4. Memory transistor 11b has a source terminal connected to the reference potential transmission line 5a. Memory transistor 11c has a source terminal connected to the reference potential transmission line 5b. Memory transistor 12d has a source terminal open-circuited.

Memory transistors 11e, 11f, 11g and 11h are disposed at respective intersections of the word lines 12a through 12d and the bit line 3b. Memory transistors 11e, 11f and 11g have their respective source terminals connected to the reference potential transmission lines 5a, 5b and 4. Memory transistor 11h have a source terminal open-circuited.

Memory transistors 11i, 11j, 11k and 11l are disposed at respective intersections of the word lines 12a through 12d and the bit line 3c. Memory transistor 11i has a source terminal open-circuited. Memory transistors 11j, 11k and 11l have their respective source terminals connected to the reference potential transmission lines 4, 5b and 5a. Memory transistors 11i through 11l have their respective gates connected to the word lines 12a through 12d.

Memory transistors 11m, 11n, 11o and 11p are deposed at respective intersections of the word lines 12a through 12d and the bit line 3d. Memory transistors 11m through 11p have their respective gates connected to the word lines 12a through 12d. Memory transistors 11m and 11n have their respective source terminals connected to the reference potential transmission line 5b. Memory transistors 11o and 11p have their respective sources connected to the reference potential transmission line 5a.

Precharge transistors 15a through 15d are provided for the bit lines 3a through 3d, respectively. Precharge transistors 15a through 15d precharge associated bit lines to Vcc level ("H") in response to the precharge signal $\phi P$.

Figure 18:
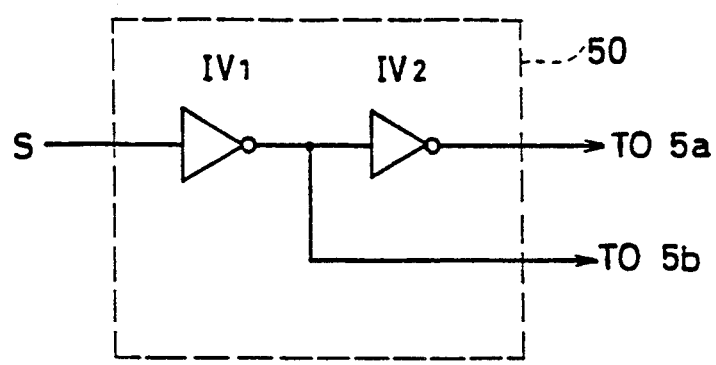
FIG. 18 illustrates an example of specific structures of a reference potential generation circuit shown in FIG. 14.

In the arrangement shown in FIG. 18, switching of potentials on the main reference lines RP1 and RP2 allows a memory cell to store data for two different addresses, similarly with the arrangement shown in FIG. 14. In other words, a single word line 12 corresponds to two different addresses.

FIG. 16 summarizes the operation of the ROM shown in FIG. 15 in a table.

Now, the case A where the reference potential transmission lines 5a and 5b receive "H" (Vcc level) potential and "L" (ground level) potential, respectively, will be described with reference to FIGS. 15 and 16.

When address 1 is designated, the word line 12a is selected to turn on the memory transistors 11a, 11e, 11i and 11m. Data of "0", "1", "1" "0" are transmitted onto respective bit lines 3a, 3b, 3c and 3d.

Upon designation of address 2, the word line 12b is selected to turn on the memory transistors 11b, 11f, 11i and 11n. Data of "1", "0", "0" and "0" are transmitted onto the bit lines 3a, 3b, 3c and 3d, respectively.

Upon designation of address 3, the word line 12c is selected to turn on the memory transistors 11c, 11g, 11k and 11o, respectively. Data of "0", "0", "0" and "1" are read out onto respective bit lines 3a, 3b, 3c and 3d.

For address 4, the word line 12d is selected. Memory transistors 11d, 11h, 11l and 11p are turned on to transmit data of "1", "1", "1" and "1" onto respective bit lines 3a, 3b, 3c and 3d.

Now, a case B where the main reference lines RP1 and RP2 receive "L" and "H" signals, respectively, is considered.

For the addresses 5, 6, 7 and 8, the word lines 12a, 12b, 12c and 12d are selected, respectively. For respective cases, data of "0, 0, 1, 1", "0, 1, 0, 1", "1, 0, 1, 0" and "1, 1, 0, 0" are read out on to the bit lines 3a through 3d.

Thus, each respective word line is selected by two different addresses. For example, the word line 12a has addresses 1 and 5 allotted thereto. 8 words by 4 bits (one word provides 4 bits) arrangement can be implemented by 4×4 memory transistors 11a through 11p.

Figure 17:
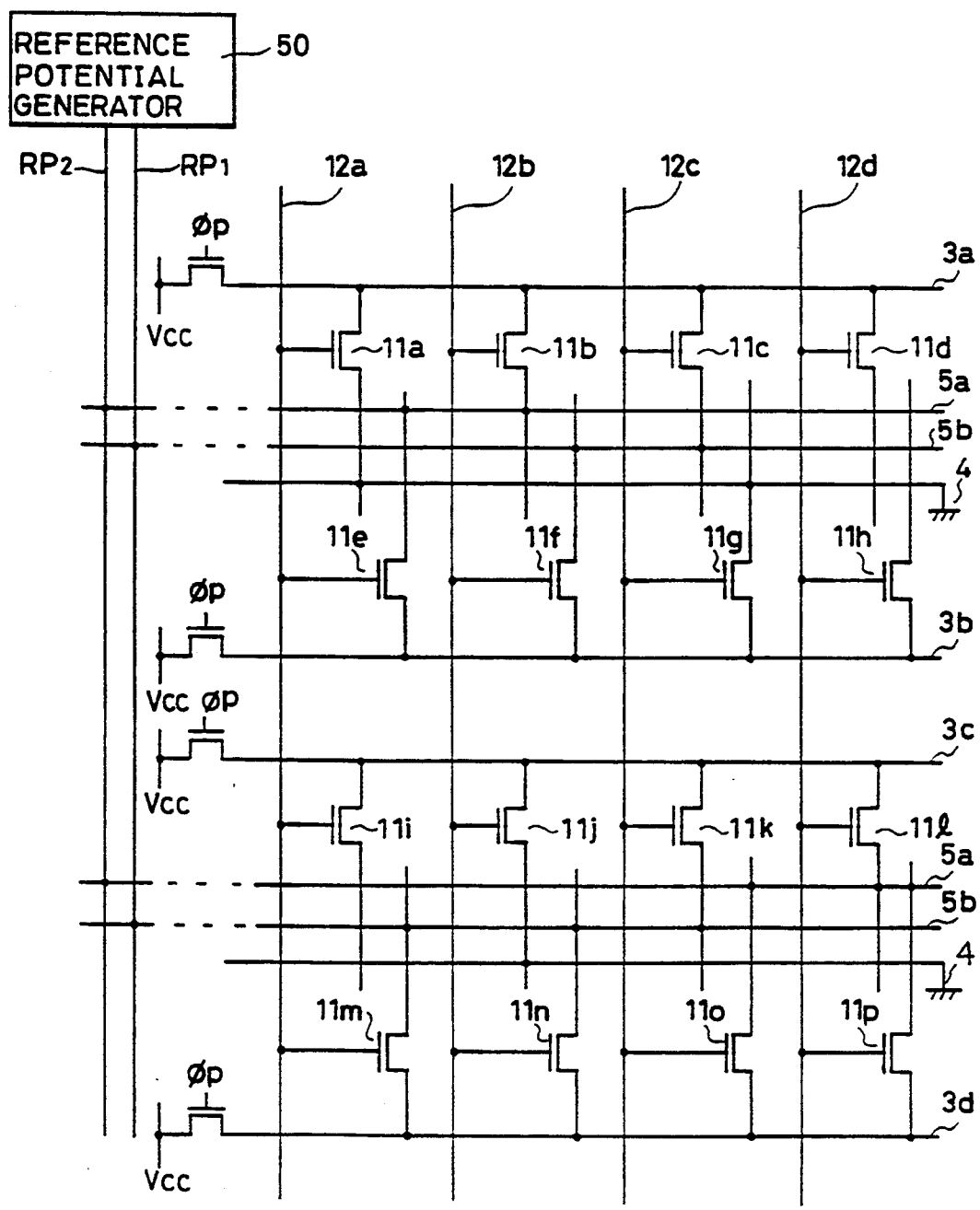
FIG. 17 shows another arrangement of memory cells according to the present invention.

FIG. 17 shows another arrangement of memory array of ROM, which arrangement is equivalent in electrical connection to the arrangement of FIG. 15.

In the arrangement of FIG. 15, a group of reference potential transmission lines 4, 5a and 5b is provided for each respective bit line 3 (the reference numeral 3 designates generically the bit lines 3a through 3d).

In the arrangement shown in FIG. 17, a group of reference potential transmission lines 4, 5a and 5b is shared between the memory transistors associated with two adjacent bit lines. More specifically, the memory transistors 11a, 11b, 11c and 11d coupled to the bit line 3a and the memory transistors 11e, 11f, 11g and 11h coupled to the bit line 3b share common reference potential transmission lines 4, 5a and 5b.

Memory transistors 11i through 11l coupled to the bit line 3c and memory transistors 11m through 11p coupled to the bit line 3d share another group of reference potential transmission line 4, 5a and 5b.

The arrangement of FIG. 17 provides the same readout data as the arrangement of FIG. 15, because the electrical connections of these arrangements are the same with each other.

According to the arrangement of FIG. 17, only a group of reference potential transmission lines 4, 5a, 5b is provided for two adjacent bit lines. Thus, interconnection area for the reference potential transmission lines is greatly reduced, to reduce the memory array area.

An arrangement may be employed in which a part of the reference potential transmission lines 4, 5a and 5b, for example a ground line 4, is arranged to be shared between the memory cells of the two adjacent bit lines.

In addition, a group of reference potential transmission lines 4, 5a and 5b may be arranged to be shared by the memory cells of more than two bit lines.

FIG. 18 illustrates an example of specific structure of the reference potential generation circuit 50 shown in FIG. 10. In FIG. 18, the reference potential generation circuit 50 includes two inverters IV1 and IV2 connected in tandem. The inverter IV1 receives the potential designating signal S. An output of the inverter IV1 is transmitted to the reference potential transmission line 5b. An inverter IV2 receives the output of the inverter IV1. The output of the inverter IV2 is transmitted to the reference potential transmission line 5a. In the structure shown in FIG. 18, the potentials of the reference potential transmission lines 5a and 5b can be determined in accordance with "H" and "L" of the potential designating signal S.

In the memory cell structure shown in FIG. 11, the reference potential transmission lines are three in number. However, the structure can be replaced with one in which the reference potential transmission lines are four in number and the source terminal of the memory cell transistor is normally connected to one of these four reference potential transmission lines.

Figure 19:
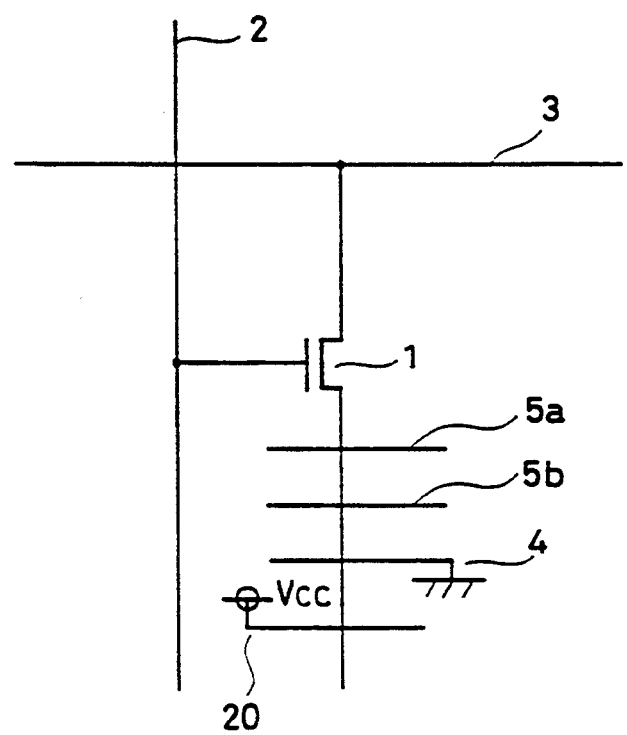
FIG. 19 illustrates another example of structures of a ROM memory cell according to the invention.

FIG. 19 illustrates an example of structure of a ROM memory cell which is an another embodiment of the invention. The structure in FIG. 19 includes, in addition to the three reference potential transmission lines 4, 5a and 5b, a fourth reference potential transmission line (e.g., power supply line) 20 adapted to transmit the reference potential Vcc which is, for instance, an operation power supply voltage.

The storage data of the memory cell is determined by the selection of the reference potential transmission lines 4, 5a, 5b and 20 actually connected to the source terminal of the memory cell transistor 1. In this case, the source terminal of the memory cell transistor 1 is connected to one of these four reference potential transmission lines 4, 5a, 5b and 20 without exception. The potential of "L" is predeterminedly transmitted to the ground line 4, and the potential of "H" is predeterminedly transmitted to the power supply line 20. The potentials of the first and second reference potential transmission lines 5a and 5b are set at "H" or "L" in response to the potential designating signal S.

Operations of the memory cell shown in FIG. 19 will be briefly described below. Description will be made with respect to a case in which the source terminal of the memory cell transistor 1 is connected to the power supply line 20. In this case, if the memory cell transistor 1 is set in the selected state, the bit line 3 maintains the unchanged potential, i.e., the precharged potential "H", regardless of the potentials of the reference potential transmission lines 5a and 5b, so that the data "1" is read from the memory cell transistor 1. If the source terminal of this memory cell transistor 1 is connected to one of the other reference potential transmission lines 4, 5a and 5b, operations will be performed similarly to that of the memory cell structures shown in FIG. 11. The operations of the memory cell shown in FIG. 19 is listed in FIG. 20.

As can be see from comparison between FIGS. 20 and 12, the memory cell structure shown in FIG. 11 and the memory cell structure shown in FIG. 19 perform substantially same operations.

Figure 3:
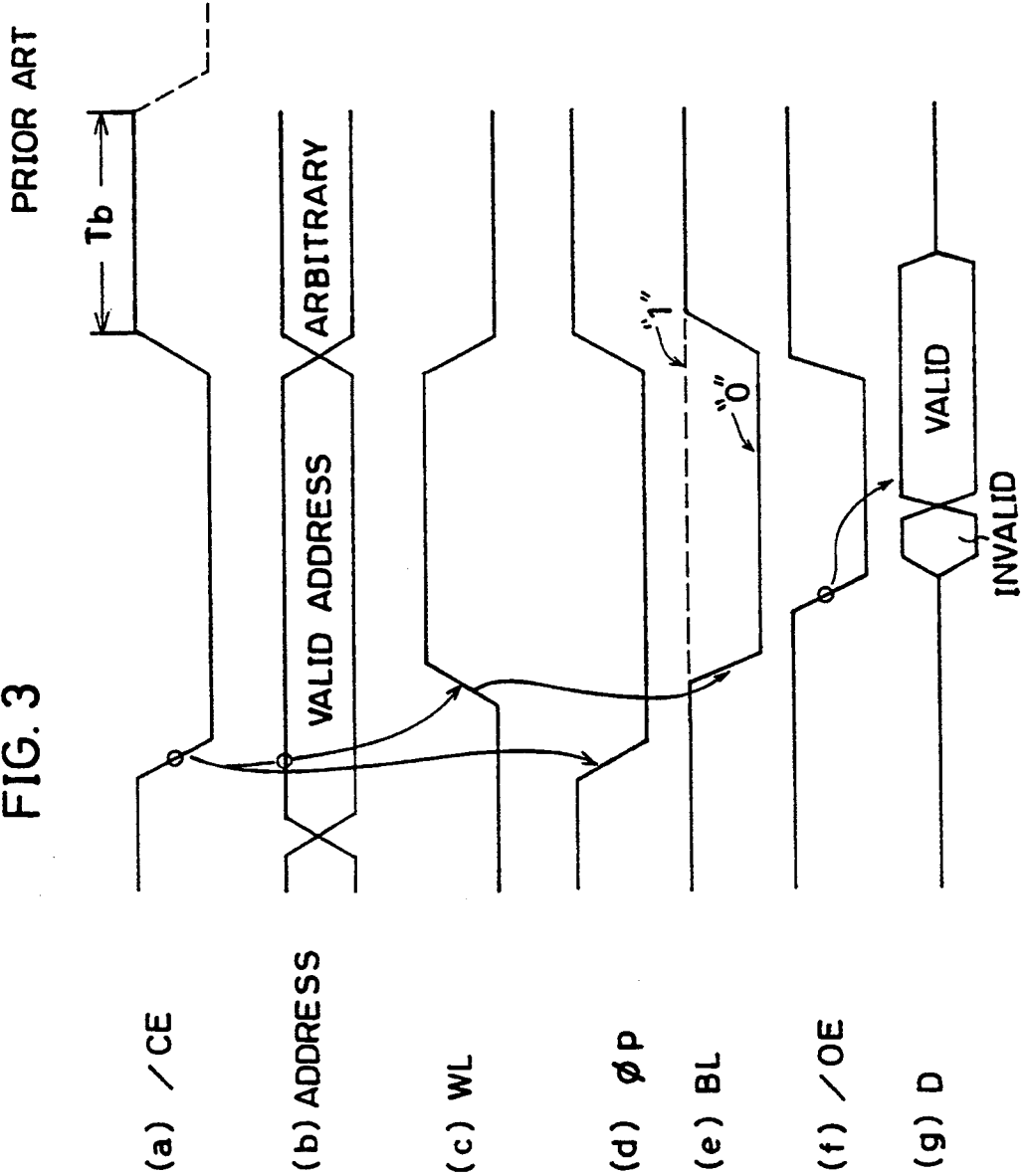
FIG. 3 is a signal waveform diagram for illustrating an operation of a prior art read only memory.

In the memory cell structure shown in FIG. 19, since any condition of connection allows the charging or discharging of the bit line 3, the ROM capable of reading the data without precharging of the bit line 3 can be obtained. Therefore, it is not necessary to provide the precharge circuit 41 and thus to consider a time period Tb (see FIG. 3) required to precharge the bit line, so that the ROM can have a small occupied area and a high operation speed.

In the ROM memory cell structure as shown in FIG. 19, the bit line 3 may be precharged not to the power supply potential Vcc but to an intermediate potential of Vcc/2 as shown in FIG. 21, in which case the charging and discharging of the bit line for the data reading is performed from the intermediate potential to "H" or "L", so that the charging and discharging operations require time periods shorter than those in the prior art device, and also require reduced currents consumption. Therefore, the ROM having the high speed and the low consumption current can be obtained.

In FIG. 21, ½ Vcc generator 500 is provided to precharge each bit line 3 to half a Vcc level. ½ Vcc generator 500 is known in DRAM (dynamic RAM) field for precharging bit lines to half a Vcc level, and such a ½ Vcc generator of DRAM may be applied to the ½ Vcc generator 500.

In the embodiments described above, three or four reference potential transmission lines are used to enable the representation of four states in the one transistor type memory cell. In these structures, one memory cell performs the function of the two conventional memory cells. Therefore, two banks can be achieved by using one ROM and the ROM can have double a capacity of the conventional ROM with the same number of memory cell transistors.

The structures described above can be expanded to structures in which one memory cell achieves the function of conventional memory cells which are N in number. For representing the states of the N memory cells by the one memory cell, it is necessary to represent the states which are $2^N$ in a total number because each state can take two states of "0" and "1". This can be achieved by providing $2^N-1$ reference potential transmission lines including the ground line or $2^N$ reference potential transmission lines including both the power supply line and the ground line.

FIG. 22 illustrates a list of the data which one memory cell can store in such a case that one ROM is used for achieving three banks A, B and C. As shown in FIG. 22, if there are provided three banks, i.e., banks A, B and C, there are eight kinds of possible data represented by the one memory cell. Therefore, as shown in FIG. 23, seven lines 55a, 55b, 56a, 56b, 57a, 57b and 58 are provided as the reference potential transmission lines. The stored information in the memory cell is determined by the connection condition of the source of the memory cell transistor 1. In the memory cell structure shown in FIG. 23, the reference potential transmission lines are controlled in pairs respectively including two of the lines.

The reference potential transmission lines 55a and 55b are used to represent the bank A, the reference potential transmission lines 56a and 56b are used to represent the bank B and the reference potential transmission lines 57a and 57b are used to represent the bank C. In this case, the potentials of the reference potential transmission line pairs are set, correspondingly to the banks A, B and C, in states reverse to the signal potentials of the reference potential transmission lines representing the other banks, respectively. Operations of the memory cell structures shown in FIG. 23 are listed in FIG. 24. As shown in FIG. 24, the potentials of only the reference potential transmission line pair corresponding to a selected bank are rendered reverse with respect to those of the reference potential transmission line pairs corresponding to the remainder of the banks. For instance, when the bank A is designated, the potential of the reference potential transmission lines 55a and 55b are set to be "L" and "H", respectively, and the remainder of the reference potential transmission lines 56a, 56b, 57a and 57b are set at "H", "L", "H" and "L", respectively. As apparent from the list in FIG. 24, the memory cell which stores the data corresponding to each of the three banks A, B and C can be obtained by the memory cell structure shown in FIG. 23.

Figures 25, 26:
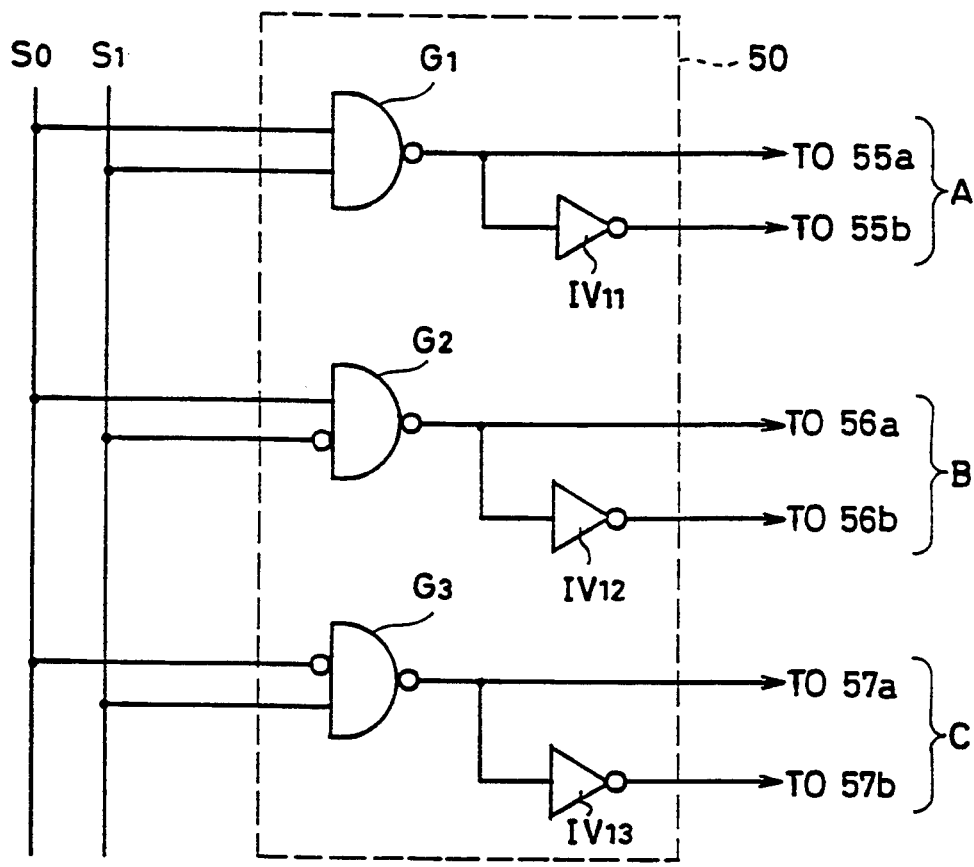
FIG. 25 illustrates an example of specific structures of a reference potential generation circuit for applying a reference potential to a reference potential transmission lines for a memory cell shown in FIG. 23.
FIG. 26 is a list for illustrating a correlation between bank selection signals and banks to be selected.

FIG. 25 illustrates an example of specific structures of the reference potential generation circuit 50 employed for representing the data of each of the three banks in this one memory cell.

In FIG. 25, the reference potential generation circuit 50 includes gate circuit G1, G2 and G3 as well as inverters IV11, IV12 and IV13. For selectively setting the banks A, B and C, bank selection signals S0 and S1 of 2 bits are used as the potential designating signals S.

The gate circuit G1 receives the signals S0 and S1. The inverter IV11 receives an output of the gate circuit G1. The output of the gate circuit G1 is transmitted to the reference potential transmission line 55a, and the output of the inverter IV11 is transmitted to the reference potential transmission line 55b. The gate circuit G1 outputs the signal of "L" when both the signals S0 and S1 are "H".

The gate circuit G2 receives the signal S0 at its true input and receives the signal S1 at its false input. The inverter IV12 receives an output of the gate circuit G2. The output of the gate circuit G2 is transmitted to the reference potential transmission line 56a, and an output of the inverter IV12 is transmitted to the reference potential transmission line 56b. The gate circuit G2 outputs the signal of "L" when the signal S0 is "H" and the signal S1 is "L".

The gate circuit G3 receives the signal S0 at its false input and receives the signal S1 at its true input. The inverter IV13 receives an output of the gate circuit G3. The output of the gate circuit G3 is transmitted to the reference potential transmission line 57a, and an output of the inverter IV12 is transmitted to the reference potential transmission line 57b. The gate circuit G3 outputs the signal of "L" when the signal S0 is "L" and the signal S1 is "H".

The reference potential generation circuit 50 shown in FIG. 25 is substantially a decoder, of which operations are listed in FIG. 26. As shown in FIG. 26, the bank A is designated when both the signals S0 and S1 are "1", the bank B is designated when they are "1" "0", and the bank C is designated when they are "0" and "1", respectively. In FIG. 26, if the data "1" and the data "0" are set to correspond to the potential "H" and "L", respectively, the signals S1 and S0 can designate the selected bank. In the combinations of the signals S1 and S0 shown in FIG. 26, if both are "0", all the outputs of the gate circuits G1-G3 become "H". Since there is no corresponding bank, this case is left as an unused condition or is used for setting the standby condition.

Figure 6:
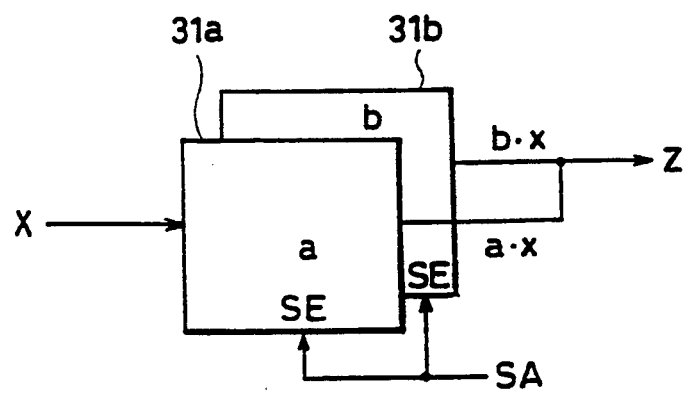
FIG. 6 illustrates an example of usage of prior art coefficient ROM's.
Figure 7:
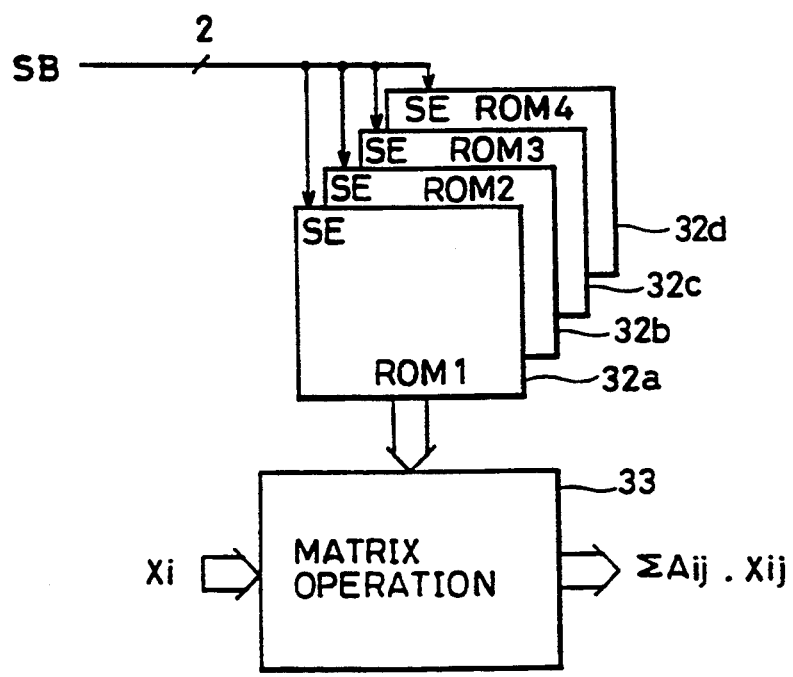
FIG. 7 schematically illustrates an example of a prior art system including coefficient ROM's with a bank structure.
Figure 8:
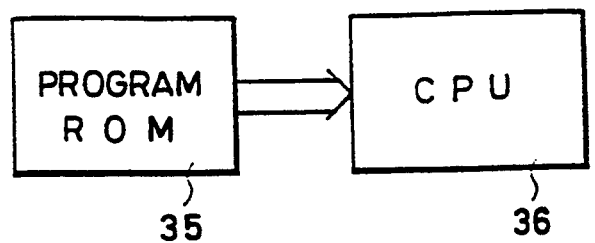
FIG. 8 illustrates an example of structures of a system including a ROM used as a program ROM.

Although the structures shown in FIG. 22-26 employ the bank selection signals as the potential designating signals, the bank selection signals may be replaced with, for instance, ROM selection signals SA and SB which select the ROM's in response to the operation modes thereof, as shown in FIG. 6 and 7. Further, the program ROM shown in FIG. 8 may have stored a program for the normal operation and a program for a test in a test operation or an interruption handling, and the programs may be switched in accordance with the operation mode, in which case operation modes designating signals may be the potential setting signals S (S0 and S1).

Further, the embodiments described above have the structures, in which one ROM represents a plurality of ROM's. Alternatively, a structure shown in FIG. 27 may be achieved.

Figure 27A:
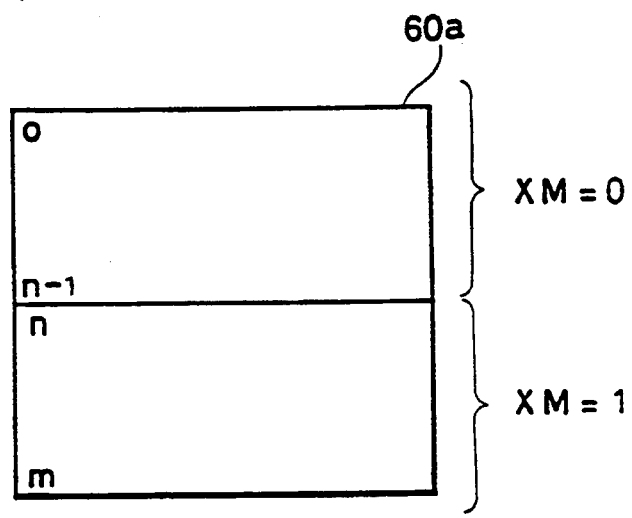
FIG. 27 schematically illustrates a structure of an array part of a ROM of still another embodiment of the invention.
Figure 27B:
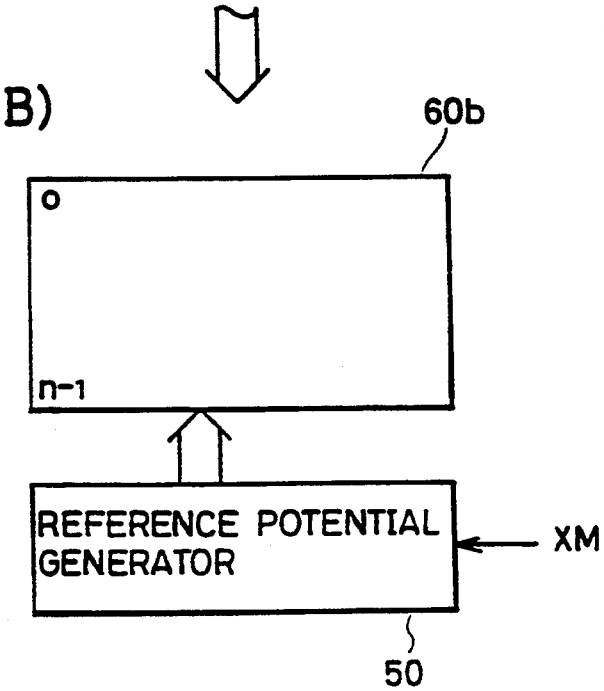

In FIG. 27, it is assumed that a memory cell array 60a has addresses 0, 1, ..., m, and each address corresponds to one word line. Further, it is assumed that, in the addresses 0, 1, ..., n-1, a most significant address bit XM corresponds to "0", and in the address from n to m, the most significant address bit XM corresponds to "1". In this case, if the most significant address bit XM is applied to the reference potential generation circuit 50 as the potential designating signal, a number of word lines in the memory cell array 60b is reduced down to a half, as shown in FIG. 27. If the number of the address bit XM is increased, the number of the memory cell transistors in the memory cell array can be further reduced. Instead of the most significant address bit, lease significant bit may be employed, in which case such structures can be obtained that the reference potential is switched between the even addresses and the odd addresses.

The open state of the memory cell transistor may be achieved by setting the region 16 in the disconnected state (no-wiring state). The memory cell transistor 1 may have any structure.

In the arrangements shown in FIGS. 13, 15 and 17, the reference potential transmission lines 4, 5a and 5b are arranged to be in parallel with the bit lines 3a, 3b, . . . . Now, the technical advantages of such arrangement will be described in the following.

Figure 28:
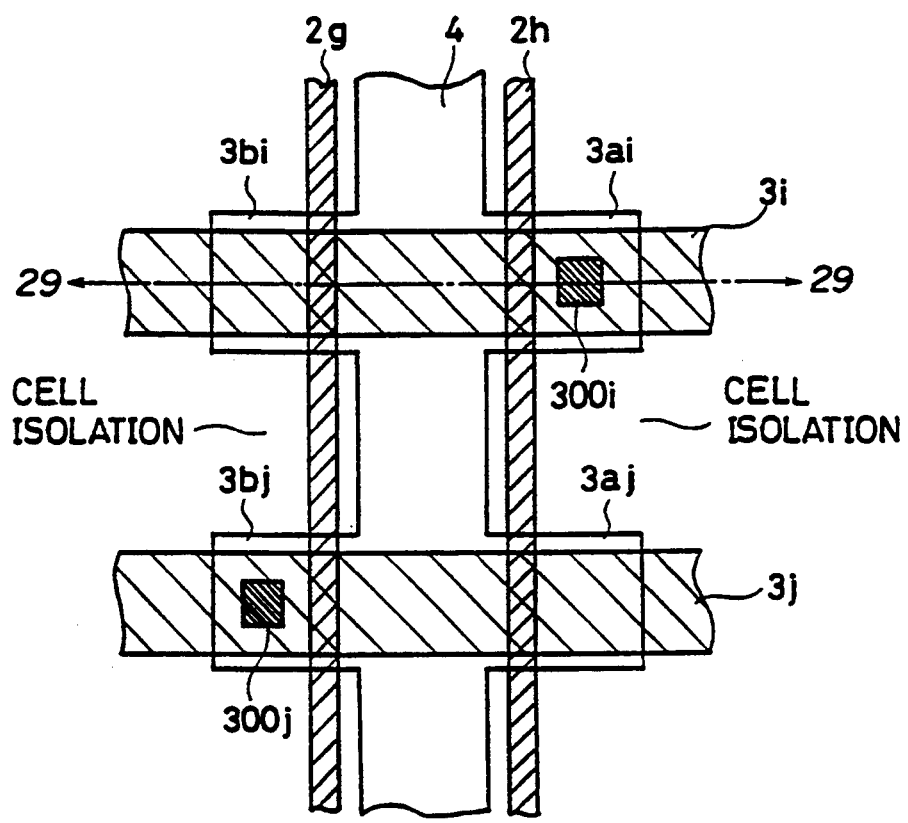
FIG. 28 illustrates a layout of a conventional ROM.
Figure 29:
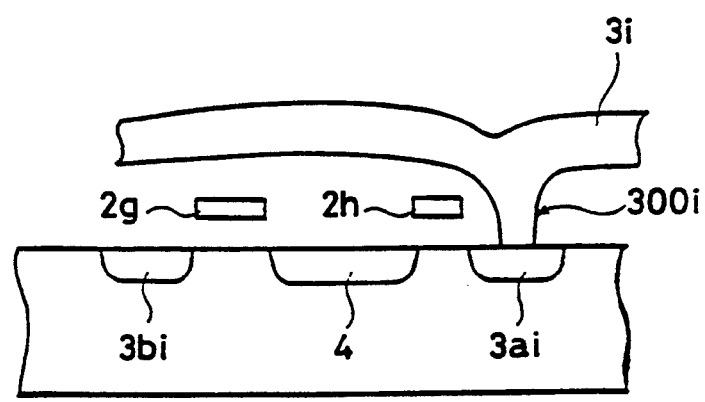
FIG. 29 is a cross sectional view taken along the line 29—29 of FIG. 28.

FIG. 28 shows a layout of conventional ROM (read only memory) cells, and FIG. 29 shows a cross sectional view along the line 29—29 shown in FIG. 28. The layout of FIG. 28 is adopted to the arrangement shown in FIG. 4.

Referring to FIG. 28, word lines 2g and 2h is arranged to be parallel with an impurity diffusion region 4 which provides a common source region for each respective memory transistor on the word lines 2g and 2h. Bit lines 3i and 3j run intersecting the word lines 2g and 2h, and the diffusion region 4.

Under the word lines 2g and 2h, a channel region is formed. The channel region may be formed of an impurity diffusion region as far as a channel is formed when a corresponding word line is selected to have "H" potential transmitted thereon. An impurity diffusion region $3ai$ is connected through a contact hole $300i$ with a bit line $3i$ comprised of a metal interconnection layer. An impurity diffusion region $3bj$ is connected to another bit line $3j$ through a contact hole $300j$. Impurity diffusion regions $3ai$, $3bi$, $3aj$ and $3bj$ provides a drain region of each memory transistor.

Referring to FIG. 29, a memory transistor comprises the impurity diffusion region $3ai$ connected through the contact hole $300i$ to the bit line $3i$, the word line $2h$ as a gate electrode, and the impurity diffusion region 4. Another memory transistor comprises the impurity diffusion region 4 as a source, the word line $2g$ as a gate, and the impurity diffusion region $3bi$ which is not connected to the bit line $3i$.

The impurity diffusion region 4 receives ground potential.

In operation, when the word line $2h$ is selected, a channel is formed under the word line $2h$ in each memory transistor associated with the word line $2h$.

Charges precharged on the bit line $3i$ are charged through the contact hole $300i$ to the diffusion region 4, while charges precharged on the bit line $3j$ are not discharged because no contact hole is formed to the diffusion layer $3aj$.

Figure 30:
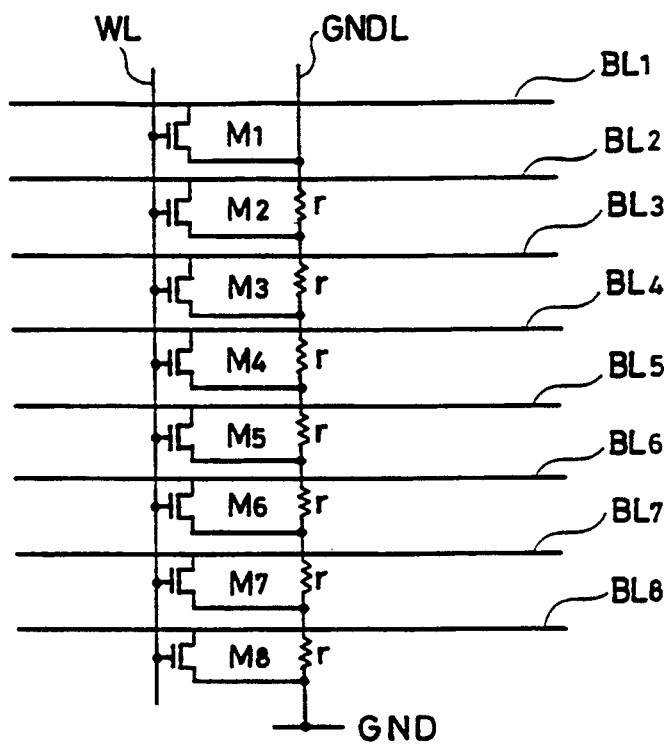
FIG. 30 is a diagram showing the arrangement of conventional ROM cells.

This arrangement causes a following problem. A word line has a plurality of memory transistors connected thereto as shown in FIG. 30. In FIG. 30, a word line WL has eight memory transistors M1 through M8. The connection of each of memory transistors M1 through M8 to corresponding bit line (BL1 through BL8) is determined depending on the storage data of each memory transistor (M1 through M8).

The impurity diffusion layer 4 comprising a ground line GNDL has a relatively large resistance, and a resistance r exits distributingly on the ground line GNDL.

Figure 31:
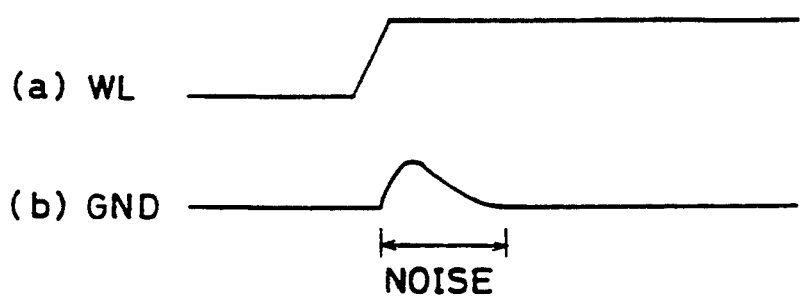
FIG. 31 shows a waveform diagram in reading data in the conventional ROM cells of FIG. 30.

If the word line WL is selected in data reading, charges on bit lines associated with memory cells storing data "0" are discharged through these memory transistors to the ground line GNDL. Consequently, a large amount of current flow flows transiently through the ground line GNDL to a ground, causing a change of the ground potential, as shown in FIG. 31. This ground potential change should be considered as a noise, which impedes a stable and reliable operation of ROM. Particularly, in fast operationization of ROM, the influence of the ground potential becomes larger, causing an increase of the access time and a decrease of operating margin of ROM.

Figure 32:
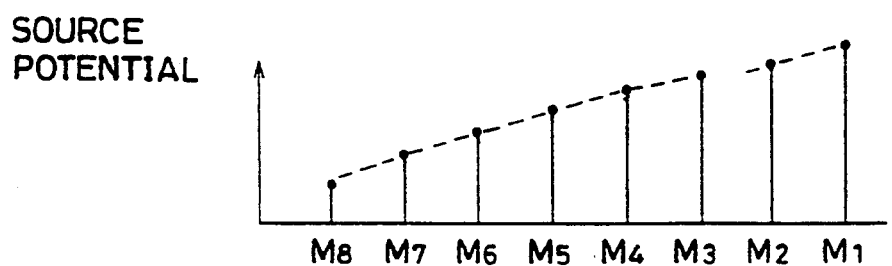
FIG. 32 shows schematically variation of source potentials in conventional ROM cells.

In addition, the resistance r is distributed on the ground potential line GNDL, which provides different source potentials for respective memory transistors M1 through M8, as shown in FIG. 32. Thus, there is a possibility that erroneous data may be read out, because of the rise of source potential.

Thus, the arrangement shown in FIG. 28 cannot be employed in the present invention. This is because if the reference potential transmission lines 4, 5a and 5b are formed of impurity diffusion regions, an accurate source potential can not be provided for the memory transistors.

Figure 33:
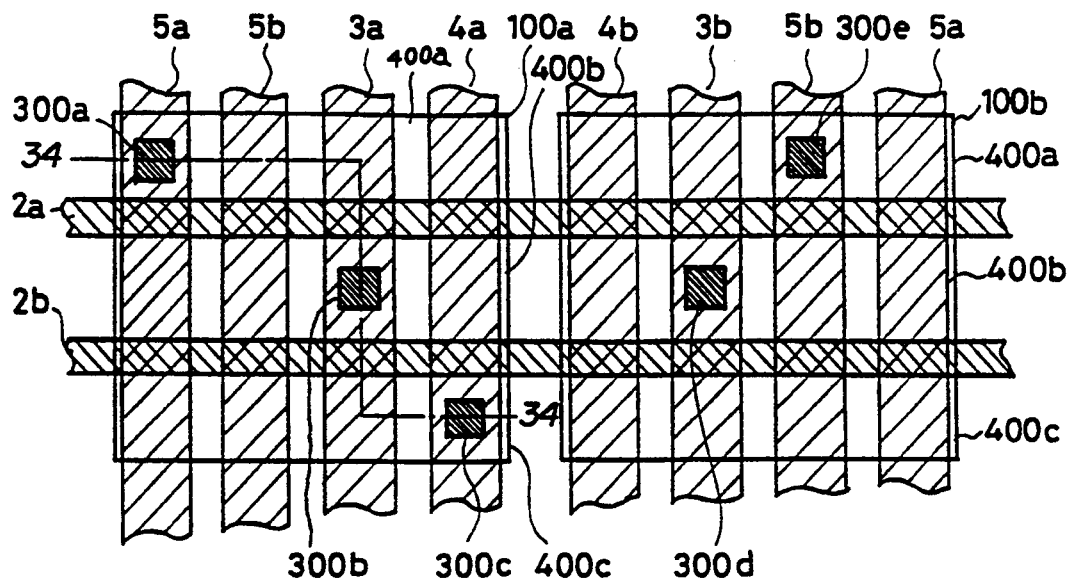
FIG. 33 shows a memory cell arrangement according to further embodiment of the present invention.

FIG. 33 shows a layout of ROM cells according to the embodiment of the present invention.

Referring to FIG. 33, active regions 100a and 100b each include two memory transistors. The active regions 100a and 100b are isolated from each other by a cell isolation region.

The active region 100a and 100b each comprise an impurity diffusion regions 400a, 400b and 400c. A channel region is formed underlying each word line 2a and 2b in each of the active regions 100a and 100b.

Bit lines 3a and 3b are arranged intersecting the word lines 2a and 2b. A reference potential transmission lines 4a, 5a, 5b and 4b are arranged in parallel with the bit lines 3a and 3b. The reference potential transmission lines 4a, 5a, 5b and 4b each are comprised of metal interconnection layer of a low resistivity such as aluminum (Al) line.

In the active region 100a, the impurity diffusion region 400a is connected to the reference potential transmission line 5a through a contact hole 300a, and the impurity diffusion region 400c is connected to a ground line 4a through a contact hole 300c.

In the active region 100b, the impurity diffusion region 400a is connected through a contact hole 300e to the reference potential transmission line 5b, and the impurity diffusion region 400c is connected to none of reference potential transmission lines 5a, 5b and 4b.

Figure 34:
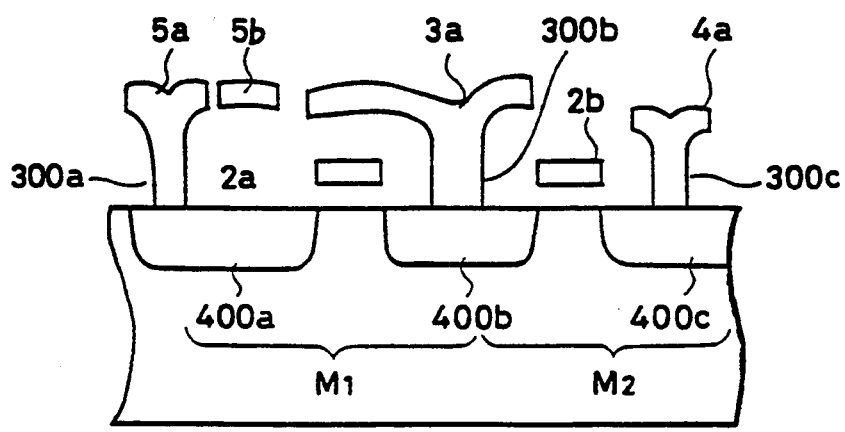
FIG. 34 shows a cross sectional view taken along the line 34—34 of FIG. 33.
Figure 35:
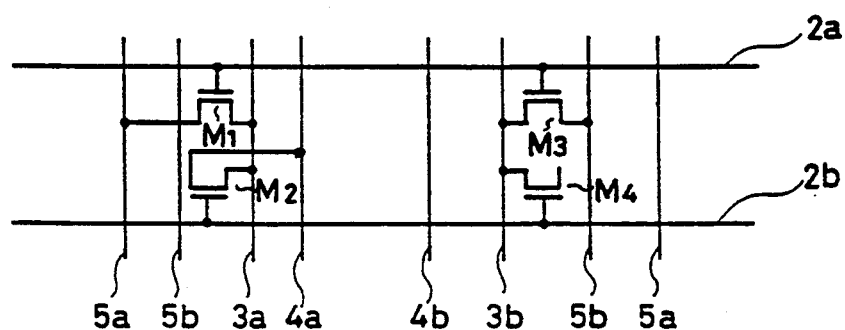
FIG. 35 shows a memory cell arrangement equivalent to the memory cell layout of FIG. 33.

FIG. 34 shows a cross sectional view along the line 34—34 of FIG. 33, and FIG. 35 shows a diagram of equivalent cell arrangement to that of FIG. 33.

Referring to FIGS. 34 and 35, a memory transistor M1 comprises the diffusion region 400b as a drain region connected to the bit line 3a through the contact hole 300b, the impurity diffusion region 400a as a source region connected through the contact hole 300a to the reference potential transmission line 5a, and the word line 2a as a gate.

Memory transistor M2 comprises the impurity diffusion region 400b as a drain, the impurity diffusion region 400c as a source connected through the contact hole 300c to the reference potential transmission line (ground line) 4a, and the word line 2b as a gate.

Memory transistor M3 comprises the impurity diffusion region 400a as a source connected to the reference potential transmission line 5b through the contact hole 300e, the impurity diffusion region 400b as a drain connected to the bit line 3b through the contact hole 300d, and the word line 2a as a gate.

Memory transistor M4 comprises the impurity diffusion region 400b as a drain connected to the bit line 3b through the contact hole 300d, the word line 2b as a gate, and the impurity diffusion region 400c as a source having no connection to any of the reference potential transmission lines 4b, 5a and 5b.

In the arrangement shown in FIGS. 33 through 35, memory transistors M1 and M3 store data determined by the potentials on the reference potential transmission lines 5a and 5b. Memory transistor M2 stores data of "0", and memory transistor M4 stores data of "1".

Data reading operation in the configuration shown in FIGS. 33 through 35 is the same as that in the arrangements shown in FIGS. 13, 15 and so on, and therefore the explanation on the operation thereof will not be repeated.

In the arrangement shown in FIGS. 33 through 35, the reference potential transmission lines 4, 5a and 5b are arranged to intersect the word lines 2a and 2b. When a word line 2a or 2b is selected, a plurality of memory transistors are simultaneously selected (in a case of a word comprising a plurality of bits). However, a reference potential transmission line 4, 5a or 5b receives a current flow at most from a single memory transistor. Thus, each reference potential transmission line 4, 5a and 5b receives less current flow than in the arrangement shown in FIG. 28, so that rise of ground potential due to discharging of bit lines can be reliably prevented.

In addition, the reference potential transmission lines 4a, 5a and 5b and 4b comprise a metal interconnection layer of a low resistivity. Thus, variation in source potential of memory transistors due to current flow can be ensurely prevented, because the small resistivity of the reference potential transmission lines 4a, 4b, 5a and 5b causes a very small, neglible voltage drop thereacross even if a current flows therethrough.

Thus, very small current flow and low resistivity in the reference potential transmission lines 4a, 4b, 5a and 5b provide, in combination, a stable and reliable fast operable ROM.

In the arrangement shown in FIGS. 33 through 35, a group of reference potential transmission lines 4, 5a and 5b is employed. However, a group of reference potential transmission lines 4, 5a and 5b and 20 may be employed.

Further, the arrangement of FIG. 33 is also applicable to the arrangements shown in FIGS. 19 nd 23.

In the embodiments described above, although one word line can represent a plurality of different addresses, simultaneous access to a same memory is impossible. Then, structures for the simultaneous access to the same memory will be described below.

Figure 36:
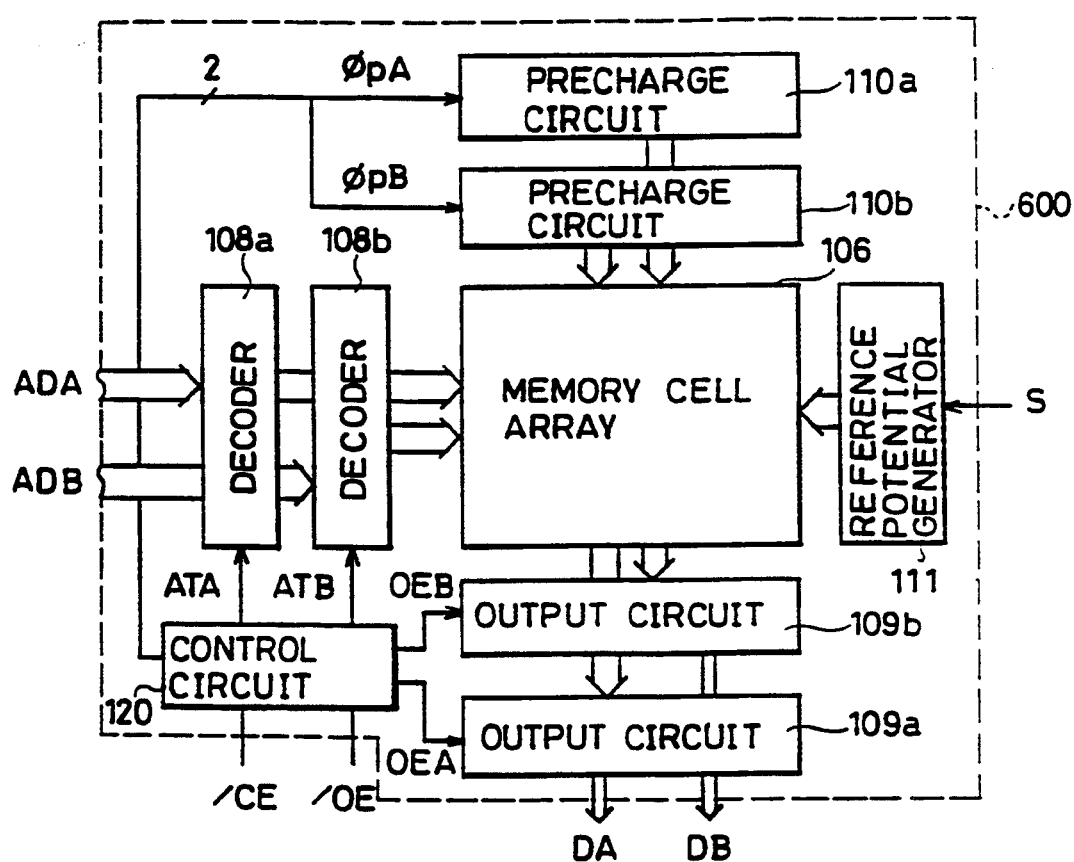
FIG. 36 illustrates a whole structure of a ROM of yet another embodiment of the invention.

FIG. 36 illustrates a whole structure of a read only memory of a further embodiment of the invention. In FIG. 36, a read only memory 600 includes a memory cell array 106 in which memory cells are arranged in columns and rows. The memory cell array 106 has an internal structure, as will be specified later, in which one memory cell can be accessed through a plurality of mutually independent paths. FIG. 36 illustrates a structure in which the memory cell array 106 can be accessed through two paths. This read only memory 600 further includes a first decoder 108a for decoding a first address input ADA and selecting a corresponding row in the memory cell array 106, a decoder 108b for decoding a second address input ADB and selecting a corresponding row in the memory cell array 106, a first output circuit 109a for outputting data of a memory cell selected by the decoder 108a in the memory cell array 106, and a second output circuit 109b for outputting data of a memory cell selected by the decoder 108b in the memory cell array 106. The first output circuit 109a outputs an output data DA and the second output circuit 109b outputs an output data DB.

This read only memory 600 further includes a control circuit 120 responsive to externally applied control signals $\overline{CE}$ and $\overline{OE}$ for outputting various internal control signals ATA′, ATB′, OEA, OEB $\phi$pA and $\phi$pB, precharge circuits 110a and 110b responsive to the internal control signals $\phi$pA and $\phi$pB for precharging potentials of the bit lines which are internal data transmission lines in the memory cell array 106, and a reference potential setting circuit 111 responsive to an externally applied reference potential setting signal S for generating reference potentials for setting information stored in the respective memory cells in the memory cell array 106. The control signals ATA′ and ATB′ provide operation timings for the first and second decoders 108a and 108b, respectively. The control signals OEA and OEB provide output timings for the output data DA and DB of the output circuits 109a and 109b.

The control circuit 120 generates the internal control signals $\phi$pA and $\phi$pB, ATA′, ATB′, OEB and OEA in response to the externally applied control signals $\overline{CE}$ and $\overline{OE}$. In the structure shown in FIG. 36, the decoder 108a and the decoder 108b operate at a same timing, the precharge circuit 110a and the precharge circuit 110b also operate at a same timing, and further the output circuit 109a and the output circuit 109b operate at a same timing. However, the operation timings of these circuits may be different. If different, two types of externally applied control signals $\overline{CE}$ and $\overline{OE}$, i.e., $\overline{CEA}$, $\overline{CEB}$, $\overline{OEA}$ and $\overline{OEB}$ may be applied to the control circuit 120 so as to activate only one of the groups. However, the following description will be made, assuming that each circuit block operates at the same timing. Although the address inputs ADA and ADB are applied to the decoders 108a and 108b, address inputs from an address buffer which receives externally applied address inputs to generate internal addresses are usually applied to the respective decoders 108a and 108b. This address buffer is eliminated in the drawings for clarification.

Figure 37:
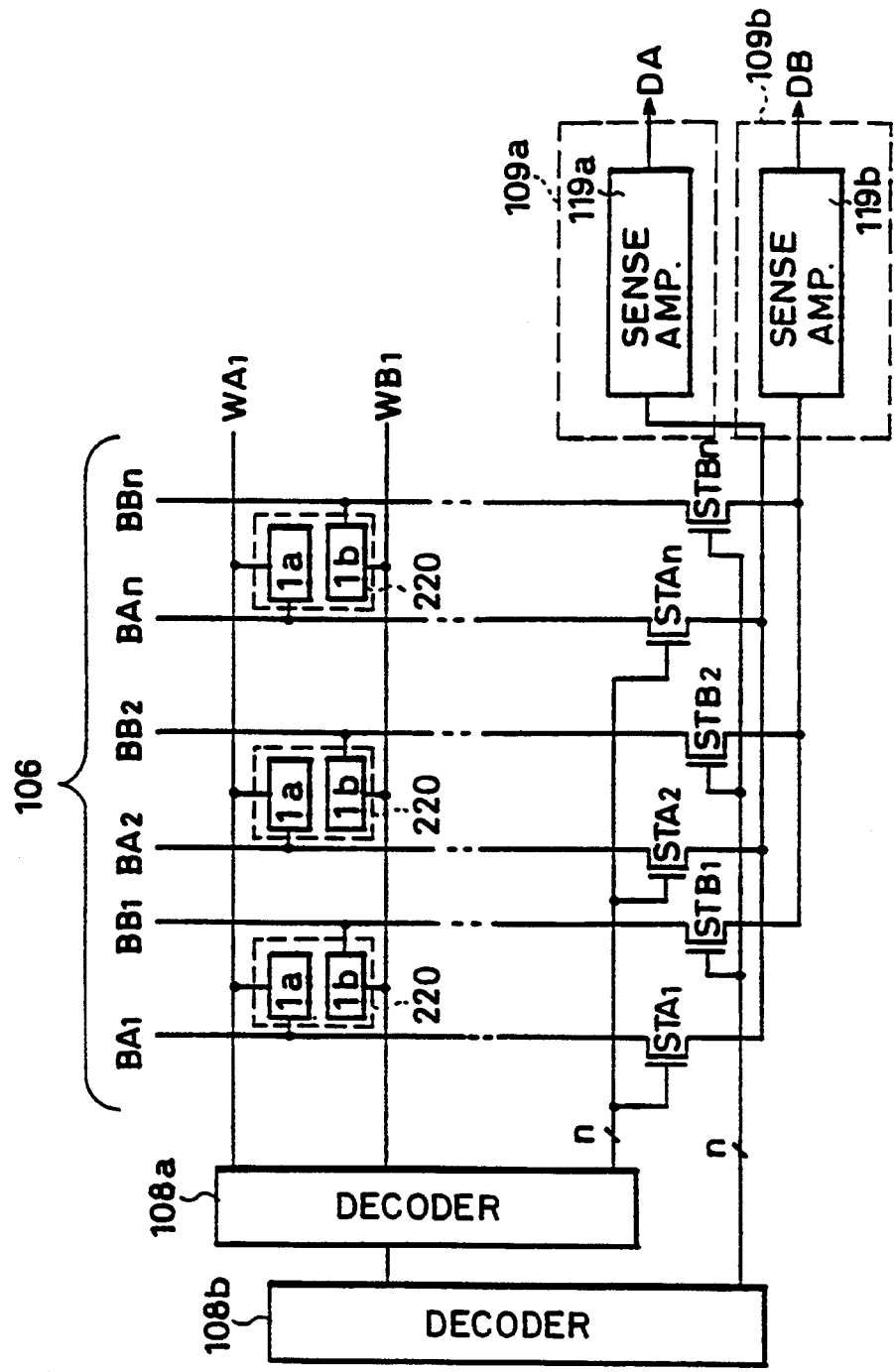
FIG. 37 schematically illustrates a structure of a major part of a read only memory shown in FIG. 36.

FIG. 37 schematically illustrates structures of a major part of a read only memory shown in FIG. 36. In FIG. 37, the memory cell array 106 includes a word line (select signal transmission line) WA1 disposed in a row direction for receiving a row selection signal from the decoder 108b, and bit lines (internal data transmission lines) BA1, BB1, BA2, BB2, . . . , BAn and BBn for transmitting information stored in a memory cell 220 connected to a selected word line. Although there are provided a plurality of word lines for receiving the output of each of the decoders 108a and 108b, FIG. 37 illustrates only the representative word lines WA1 and WB1 which receive one output from the decoder 108a and one output from the decoder 108b, respectively. Each memory cell 220 includes a first memory element 1a, which is set in the selected condition in response to the selection signal on the word line WA1 and transmits the stored information to the corresponding bit line BAi (i=1, 2, . . . , n), and a second memory element 1b, which is set in the selected condition in response to the selection signal on the word line WB1 and transmits the stored information to the corresponding bit line BBi (i=1, 2, . . . , n).

The memory cell array 106 further includes column selection transistors STA1–STAn, which are associated to the respective bit lines BA1–BAn and are adapted to be turned on in response to the selection signal from the decoder 108a for connecting the corresponding bit lines to the output circuit 109a, and column selection transistors STB1–STBn, which are associated to the respective bit lines BB1–BBn and are adapted to be turned on in response to the selection signal from the decoder 108b for connecting the corresponding bit lines to the output circuit 109b. The decoder 108a applies the column selection signals to the respective selection transistors STA1–STAn to turn on one of them. Similarly, the decoder 108b applies the column selection signals to the respective selection transistors STB1–STBn to turn on one of them. In FIG. 37, the selection signal transmission lines, which are used for the column selection signals from the decoders 108a and 108b, are illustrated in an n-bit width. The output circuits 109a and 109b include sense amplifiers 119a and 119b respectively adapted to sense the data in the selected memory cells for amplifying and outputting it. As shown in FIG. 37, since the one memory cell 220 includes the two independently selectable memory elements 1a and 1b, two kinds of data in the memory cell can be simultaneously output, and also same memory cell data can be output from the two output circuits 109a and 109b.

Figure 38:
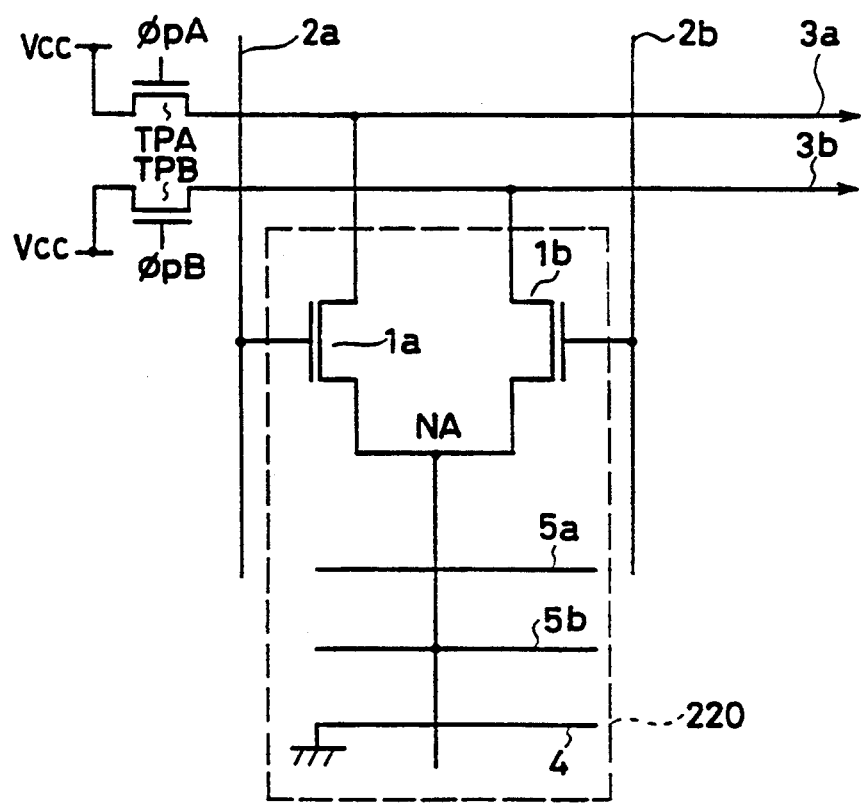
FIG. 38 illustrates a structure of a memory cell included in a read only memory shown in FIG. 36.

FIG. 38 illustrates a specific structure of the memory cell 220 shown in FIG. 37. In FIG. 38, the memory cell 220 includes two memory transistors 1a and 1b. The memory transistor 1a has a gate coupled to a word line 2a, a drain coupled to a bit line 3a and a source coupled to a common node NA. The memory transistor 1b has a gate coupled to a word line 2b, a drain coupled to a bit line 3b and a source coupled to a common node NA. The word lines 2a and 2b correspond to the word lines WA1 and WB1 shown in FIG. 37. Further, the bit lines 3a and 3b correspond to the bit lines BAi and BBi (i=1, 2, . . . , n), respectively.

The memory cell 220 further includes the reference potential transmission lines 5a, 5b and 4 to which the reference potentials are transmitted, respectively. Here, the reference potential transmission line 4 has the potential set at the "L" level which is, for instance, the ground potential level. The reference potential generation circuit 111 shown in FIG. 36 transmits the reference potentials to the reference potential transmission lines 5a and 5b. The bit lines 3a and 3b each have provided at one side with precharge transistors TPA and TPB, which are turned on, in response to the precharge signals $\phi$pA and $\phi$pB, to precharge the bit lines 3a and 3b to "H" which is, for instance, the operation power supply potential Vcc level. Other ends of the bit lines 3a and 3b are connected to selection transistors STAi and STBi.

The reference potential transmission lines 5a and 5b receive combinations of the reference potentials which are similar to those in FIG. 12. The memory elements 1a and 1b store the same data. The word lines WAi and WBi each represent two addresses. A read operation of the data in one of the memory elements 1a and 1b is performed in a manner similar to that already described with reference to FIG. 12.

The stored information in the memory transistors 1a and 1b are determined by whether the source terminals thereof are connected through the common node NA to the ground potential transmission line 4, to the first reference potential transmission line 5a or to the second reference potential transmission line 5b, or by whether this common node NA is in the open state disconnected from all the reference potential transmission lines. Two kinds of reference potentials are transmitted to the reference potential transmission lines 5a and 5b from the reference potential setting circuit 111 (see FIG. 36). The reference potential setting circuit 111 responds to the externally applied reference potential setting signal S for the setting the reference potentials of the reference potential transmission lines 5a and 5b. This reference potential setting signal S may be any signal such as an operation mode designating signal, bank selection signal or address signal. Therefore, by the arrangement of the reference potential transmission lines 5a and 5b and the ground potential transmission line 4 common to all the memory cells 220, two kinds of data can be stored in every memory cell 220.

The memory cell 220 includes two memory transistors 1a and 1b. The memory transistor 1a is turned on in response to the selection signal WL on the word line 2a (WAi). The other memory transistor 1b is turned on in response to the selection signal WL on the word line 2b (WBi). Therefore, when the word line 2a is selected, the stored information in the memory cell 220 is transmitted to the bit lane 3a, and, even if the word line 2b is simultaneously selected, the stored information in the memory cell 220 is transmitted to the bit line 3b through the memory cell transistor 1b. Therefore, the one memory cell 220 can be simultaneously accessed to read the information therein through the two paths. In other words, this memory cell 220 and a different memory cell can be simultaneously accessed to read the data in these two memory cells in parallel. Then, description will be made with respect to operations for simultaneously accessing different addresses in a same memory cycle.

Figure 39:
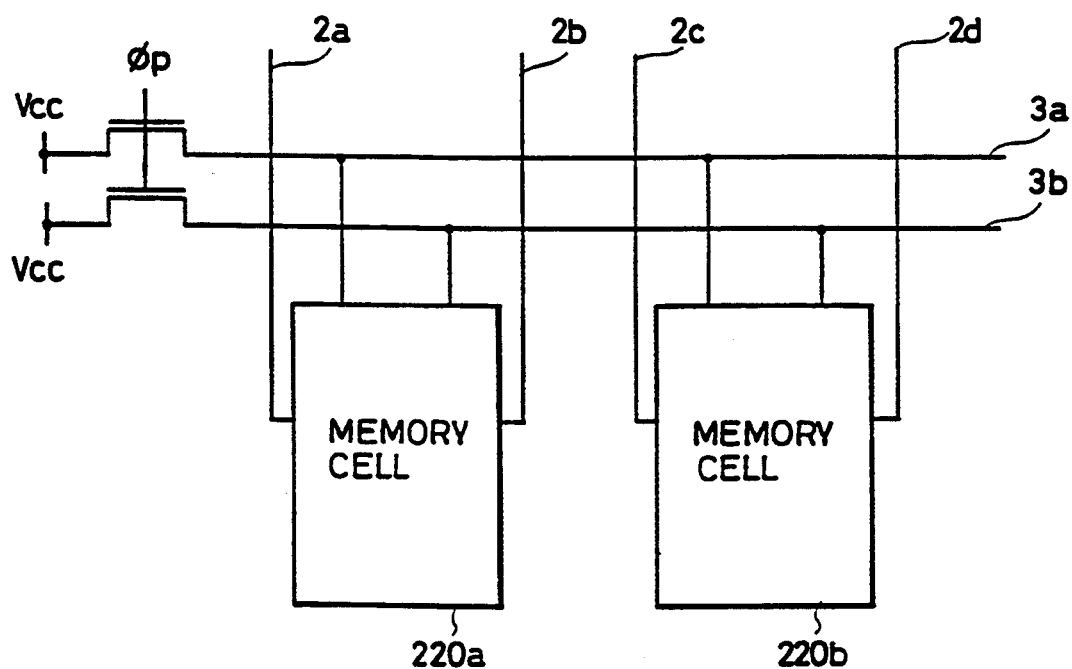
FIG. 39 is a view for illustrating an operation mode of a read only memory shown in FIG. 36.

FIG. 39 illustrates an example of arrangement of two words (one word includes one bit) using the memory cell shown in FIG. 38. In FIG. 39, a memory cell 220a is set in the selected state by either the word line 2a or 2b. When the word line 2a is set in the selected state, the memory cell 220a transmits the stored information to the bit line 3a. When the word line 2b is set in the selected state, the memory cell 220a transmits the stored information to the bit line 3b. A memory cell 220b is selected by word lines 2c and 2d. When the word line 2c is set in the selected state, the memory cell 220b transmits the stored information to the bit line 3a. When the word line 2d is set in the selected state, the memory cell 220b transmits the stored information to the bit line 3b. The word lines 2a and 2c are selected by the decoder 108a shown in FIG. 36, and the word lines 2b and 2d are selected by the decoder 108b shown in FIG. 36.

Consideration will now be made to a case where the word line 2a is set in the selected state in connection with the memory cell 220a. In this case, the stored information in the memory cell 220a is transmitted to the bit line 3a. Also, with respect to the memory cell 220b, the decoder 108b can set the word line 2d in the selected state. In this case, the stored information in the memory cell 220b is transmitted to the bit line 3b. The data in the bit lines 3a and 3b can be transmitted individually through the column selection transistors STAi and STBj to the output circuits 109a and 109b. Therefore, in one memory cycle, the stored information in the memory cell 220a and the stored information in the memory cell 220b can be simultaneously read out.

In this case, the word lines 2b and 2c may be set in the selected state so that the memory cells 220a and 220b may transmit the information stored therein to the bit lines 3b and 3a, respectively. Therefore, the decoders 108a and 108b may be simultaneously driven to select the two memory cells for simultaneously reading the information in these selected memory cells.

Also in the structure of the memory cell in FIG. 39, the stored information in the respective memory cells 220a and 220b are determined by the connection relationship between the reference potential transmission lines and the common node NA, and by the reference potentials transmitted to the reference potential transmission lines, similarly to those shown in FIG. 12. In this case, each of the memory cells 220a and 220b can store a plurality of words. Therefore, one memory cell can store the information of a plurality of words in accordance with its operation modes and can also reduce the occupied area of the ROM to half or less the area occupied by the conventional ROM. Further, this ROM can simultaneously read the data from a plurality of memory cells so that the occupied area thereof can be smaller than the area occupied by two chips of the conventional ROM. This implements the ROM having the small occupied area and the large storage capacity.

The reference potential generation circuit 111 may be formed of the circuit shown in FIG. 18.

FIG. 38 illustrates the memory cell structure including the three reference potential transmission lines. Alternatively, a structure similar to the structures in FIG. 23 may be employed in which four reference potential transmission lines are provided and the common node NA of the memory cell transistors 1a and 1b is normally connected to one of these four reference potential transmission lines.

Figure 40:
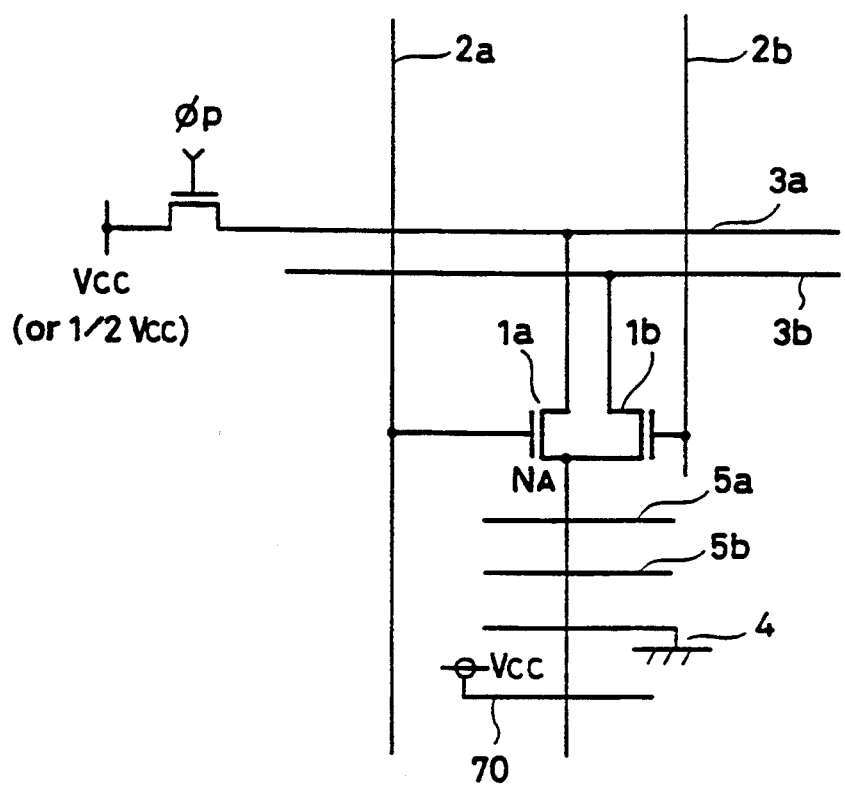
FIG. 40 is a list illustrating correlation between, storage information in memory cells shown in FIGS. 37 and 38, and connection conditions between a common node and reference potential transmission lines.

FIG. 40 illustrates a structure of a memory cell of a ROM which is another embodiment of the invention. In FIG. 40, in addition to the three reference potential transmission lines 4, 5a and 5b, there is provided a fourth reference potential transmission line (power supply line) 70 for transmitting the reference potential Vcc (e.g., operation power supply voltage). The stored data in the memory cell is determined by the reference potential transmission lines 4, 5a, 5b or 70 to which the common node NA of the memory cell transistors 1a and 1b is connected. In this case, the common node NA of the memory cell transistors 1a and 1b is normally connected to one of these reference potential transmission lines 4, 5a, 5b and 70. The potential of "L" is normally transmitted to the ground potential transmission line 4 and the potential of "H" is normally transmitted to the power supply potential transmission line 70. The potentials of the first and second reference potential transmission lines 5a and 5b are set at either "H" or "L" in response to the potential setting signal S.

The structure is equivalent to the structures as shown in FIG. 19 and the stored data therein is same as that shown in FIG. 20, so that detailed description thereof will not be made hereinafter. Further, the structure can be expanded to the structures shown in FIG. 23, and also may be provided with $2^N-1$ or $2^N$ reference potential transmission lines so as to represent N states by one memory transistor. As a reference potential setting circuit in each case, it is possible to use the circuit previously described with reference to a one-memory-cell-/one-transistor structure.

In the above embodiments, there have been described the structures in which the memory cell includes the two memory cell transistors and two kinds of memory cell data can be read in parallel from the read only memory. However, the number of the transistor included in this memory cell may be three or more.

In the structure of the read only memory shown in FIG. 36, the control circuit 120 generates various internal control signals in response to the control signals $\overline{CE}$ and $\overline{OE}$. However, an address transition detection circuit may be provided for detecting change of externally applied address inputs ADA and ADB, and outputs of this address transition detection circuit may be used as control signals for determining the internal operation timings. Further, decoding operation timings of the decoders 108a and 108b may not be determined by the control signal from the control circuit 120, but the address inputs ADA and ADB may be decoded as received. In this case, the output states of the decoders 108a and 108b remain same until the address inputs ADA and ADB change.

The structure using the address transition detection signal as the internal clock signal may be applied to the read only memory shown in FIG. 10.

The reference potential transmission lines 4 and 70 may be constructed to receive the ground potential and the power supply potential from an external.

Figure 9:
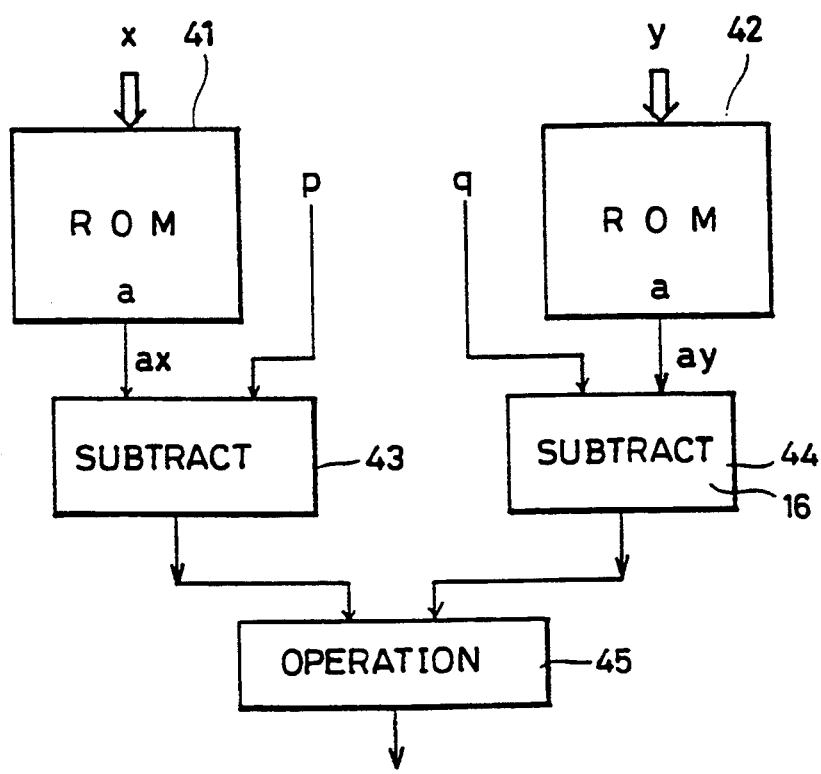
FIG. 9 illustrates an example of structures of a control system using a prior art ROM.

The above described memory cell structures shown in FIG. 38 and 40 enable the control system shown in FIG. 9 to be constructed using only one ROM, and thus the control system having a small occupied area can be constructed.

For the memory cell arrangement for the dual port ROM, the arrangements of FIGS. 33 through 35 may also be employed.

In a multi-processor system for digital signal processing purposes, the ROM of the invention can be used as a common memory to construct a system in a small area, which can implement a high speed data processing.

In the present invention, as described hereinabove, there are provided the reference potential transmission lines of which potentials are changeable, and the data is stored by virtue of the connection relationship between the memory cell transistors and these reference potential transmission lines. This enables the storage of a plurality of different word bids with the one memory cell transistor, and thus reduces the scales of the ROM. Thereby, e.g., for the digital signal processing purposes, the occupied area of the ROM integrated together with the signal processing circuit on a same chip can be remarkably reduced. Further, this also remarkably reduces the number of the transistors in the memory cell array, and ensure a sufficiently large memory transistor formation region in a same area.

Further, according to the structures of the invention, one word line can correspond to a plurality of addresses, so that the number of the word lines can be remarkably reduced as compared with that in the conventional device, which also enables remarkable reduction of the scales of circuitry in the address decoder part. For example, if one memory cell represents two different word bits, the one word line corresponds to the two addresses, so that the number of the transistors in the memory cell array is reduced half ($\frac{1}{2}$) and the number of the word lines is reduced half ($\frac{1}{2}$) as compared to those of the conventional device, whereby the device scales of the address decoder are reduced half or less.

Further, since the one memory cell is formed of the memory transistors which are mutually independently accessible, so that a plurality of memory cells can be simultaneously accessed in the same cycle and further the same memory cell can be accessed in the same memory cycle.

As described hereinabove, it is possible to provide the read only memory which has the function possessed by a plurality of conventional semiconductor memory devices and is suitable to highly integrated structures with a small occupied area and a large storage capacity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A read only memory device comprising:
   at least one bit line for transmitting internal data;
   a plurality of word lines to which row driving signals are transmitted, respectively;
   at least three reference potential transmission lines each for transmitting a potential;
   potential setting means responsive to a potential designating signal for selectively establishing a potential of each of at least two of said at least three reference potential transmission lines; and
   a plurality of memory cells disposed at respective intersections between said at least one bit line and respective said word lines for respectively storing data, each memory cell including a transistor element for connecting or disconnecting one of said at least three reference potential transmission lines to and from an associated bit line in response to said row driving signal on an associated word line, wherein
   each memory cell can store multi-data of different addresses.

2. A read only memory device according to claim 1, wherein said potential setting means includes means for setting the potentials of said at least three reference potential transmission lines in different combinations of potentials in accordance with said potential designating signal.

3. A read only memory device according to claim 1, wherein each of said memory cells consists of one transistor element.

4. A read only memory device according to claim 1, wherein said at least three reference potential transmission lines are arranged to be parallel with said at least one bit line.

5. A read only memory device according to claim 4, wherein said at least three of reference potential transmission lines are arranged to be shared between memory cells provided for two adjacent bit lines.

6. A memory cell for storing multi-data of different addresses, comprising:
   a transistor element having a control electrode for receiving a row selection signal, a first conduction terminal for receiving a reference potential and a second conduction terminal for transmitting stored data to an internal data transmission line, said reference potential being selectively established in response to an externally applied potential designating signal, said reference potential determining said stored data in said memory cell and said reference potential established to a first level in a first access cycle for accessing said memory cell and to a second level in a second access cycle for accessing said memory cell.

7. A memory cell for storing multi-data of different addresses, comprising:
   a transistor element having a control electrode for receiving a row selection signal, a first conduction terminal having one of either of two states, i. an open state, and ii. receiving a reference potential; and a second conduction terminal for transmitting stored data to an internal data transmission line;

said reference potential being selectively established in response to an externally applied potential designating signal to a first level in a first access cycle for accessing said memory cell and to a second level in a second access cycle for accessing said memory cell.

8. A storage element for storing multi-data of different addresses comprising:

a first transistor element having a control electrode coupled to receive a first row select signal, a first conduction terminal coupled to a common node and a second conduction terminal coupled to a first internal data transmission line; and a second transistor element having a control electrode coupled to receive a second row select signal generated independently of said first row select signal, a first conduction terminal coupled to the common node, and a second conduction terminal coupled to a second internal data transmission line;

said common node coupled to one of at least three reference potential transmitting lines to receive a reference potential thereon selectively established in response to an applied potential designating signal.

9. A semiconductor read only memory device comprising:

a plurality of word lines and a plurality of bit lines arranged in a plurality of rows and columns;

at least three voltage reference lines;

a plurality of memory cells arranged in a matrix, each memory cell being able to store multi-data of different addresses and comprising at least one transistor having a control electrode connected to a respective one of said word lines, a first conduction terminal directly connected to a respective one of said bit lines, and a second conduction terminal being connected in one of either the two following manners, i. directly connected to one of said voltage reference lines, and ii. disconnected from all of said voltage reference lines; and means for selectively establishing the voltage level of at least one of said at least three voltage reference lines.

10. A semiconductor read only memory device as recited in claim 9, wherein each memory cell comprises two transistors, the second conduction terminal of each of said two transistors being connected in common to one of said voltage reference lines.

11. In a storage element including a transistor element having a first conduction terminal at one, but not both, of either of two states, i. an open state, and ii. a state of receiving a reference potential, said storage element storing multi-data of different addresses, a method of reading data comprising the steps of:

selectively establishing a potential at said first conduction terminal according to an externally applied potential designating signal in any access cycle for access to said storage element; and according to an applied address, rendering said transistor element conductive to form a current flow path between said first conduction terminal and an internal data transmission line.

12. In a storage element including a transistor element having a first conduction terminal coupled to receive a reference potential, said storage element storing multi-data of different addresses, a method of reading data comprising the steps of:

selectively establishing potential at said first conduction terminal according to an externally applied potential designating signal in any access cycle for access to said storage element; and according to an applied address, rendering said transistor element conductive to form a current flow path between said first conduction terminal and an internal data transmission line.

* * * * *